US010859624B2

(12) United States Patent
Uemura et al.

(10) Patent No.: US 10,859,624 B2
(45) Date of Patent: Dec. 8, 2020

(54) SEMICONDUCTOR DEVICE, ELECTRONIC CONTROL UNIT AND VEHICLE APPARATUS

(71) Applicant: Renesas Electronics Corporation, Tokyo (JP)

(72) Inventors: Akira Uemura, Tokyo (JP); Osamu Soma, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 633 days.

(21) Appl. No.: 15/366,985

(22) Filed: Dec. 1, 2016

(65) Prior Publication Data

US 2017/0184658 A1   Jun. 29, 2017

(30) Foreign Application Priority Data

Dec. 24, 2015 (JP) ................................. 2015-251536
Sep. 13, 2016 (JP) ................................. 2016-178867

(51) Int. Cl.
*G01R 31/26* (2020.01)
*H02H 1/00* (2006.01)
(Continued)

(52) U.S. Cl.
CPC ................ *G01R 31/26* (2013.01); *B60L 1/16* (2013.01); *B60L 58/10* (2019.02); *G01K 3/005* (2013.01); *G01K 7/01* (2013.01); *G01K 13/00* (2013.01); *G01R 31/006* (2013.01); *H01L 23/49541* (2013.01); *H01L 23/49575* (2013.01);
(Continued)

(58) Field of Classification Search
None
See application file for complete search history.

(56) References Cited

U.S. PATENT DOCUMENTS

2002/0093360 A1* 7/2002 Nagata ............... G01R 31/2884
361/86
2011/0188163 A1* 8/2011 Ando ...................... H02H 9/02
361/57
(Continued)

FOREIGN PATENT DOCUMENTS

JP        2006-131048 A      5/2006

*Primary Examiner* — Nasima Monsur
(74) *Attorney, Agent, or Firm* — McGinn IP Law Group, PLLC

(57) ABSTRACT

A semiconductor device includes first and second semiconductor chips mounted on one package. In the first semiconductor chip, a current generation circuit generates a sense current in accordance with a load current and a fault current indicating that an abnormality detection circuit has detected an abnormality, and allows either one of the currents to flow through a current detecting resistor in accordance with presence or absence of detection of the abnormality. In the second semiconductor chip, a storage circuit stores a current value of the fault current obtained in an inspection process of the semiconductor device as a determination reference value. An arithmetic processing circuit sets a standard range based on the determination reference value, and determines presence or absence of detection of the abnormality based on whether or not a current value indicated by a digital signal of an analog-digital conversion circuit is included within the standard range.

20 Claims, 21 Drawing Sheets

(51) Int. Cl.
  *H01L 27/02* (2006.01)
  *H01L 27/06* (2006.01)
  *H01L 25/065* (2006.01)
  *H01L 25/18* (2006.01)
  *H01L 23/495* (2006.01)
  *G01R 31/00* (2006.01)
  *G01K 13/00* (2006.01)
  *B60L 1/16* (2006.01)
  *G01K 7/01* (2006.01)
  *G01K 3/00* (2006.01)
  *H02H 3/087* (2006.01)
  *B60L 58/10* (2019.01)
  *H01L 23/00* (2006.01)

(52) U.S. Cl.
  CPC .......... *H01L 25/0655* (2013.01); *H01L 25/18* (2013.01); *H01L 27/0207* (2013.01); *H01L 27/0617* (2013.01); *H02H 1/0007* (2013.01); *H02H 3/087* (2013.01); *H01L 24/48* (2013.01); *H01L 27/0248* (2013.01); *H01L 2224/48247* (2013.01); *H01L 2924/00014* (2013.01); *H01L 2924/1207* (2013.01); *H01L 2924/13091* (2013.01); *H01L 2924/1426* (2013.01); *H01L 2924/1434* (2013.01); *H01L 2924/14253* (2013.01); *Y02T 10/705* (2013.01); *Y02T 10/7005* (2013.01)

(56) References Cited

U.S. PATENT DOCUMENTS

| | | | |
|---|---|---|---|
| 2013/0055052 A1* | 2/2013 | Kaeriyama | H01L 25/162 714/799 |
| 2014/0239988 A1* | 8/2014 | Soma | G01R 31/31715 324/750.3 |
| 2015/0162747 A1* | 6/2015 | Iwasaki | H02H 9/02 361/90 |
| 2016/0305989 A1* | 10/2016 | Soma | G01R 19/32 |

* cited by examiner

IN LOAD DRIVING (NORMAL OPERATION)

IN LOAD SHORT-CIRCUIT (OCCURRENCE OF ABNORMALITY)

OVERLAP IN NORMAL OPERATION AND IN ABNORMALITY OCCURRENCE

SEMICONDUCTOR DEVICE, ELECTRONIC CONTROL UNIT AND VEHICLE APPARATUS

CROSS-REFERENCE TO RELATED APPLICATION

The present application claims priority from Japanese Patent Applications No. 2015-251536 filed on Dec. 24, 2015, and No. 2016-178867 filed on Sep. 13, 2016, the contents of which are hereby incorporated by reference into this application.

TECHNICAL FIELD OF THE INVENTION

The present invention relates to a semiconductor device, an electronic control unit and a vehicle apparatus. And, the present invention relates to, for example, a technique for driving various loads inside the vehicle through a wire harnesses and for detecting various abnormalities.

BACKGROUND OF THE INVENTION

For example, Japanese Patent Application Laid-open Publication No. 2006-131048 (Patent Document 1) has disclosed a configuration in a vehicle-use headlight lighting control device in which a microcomputer controls a headlight through a semiconductor relay.

SUMMARY OF THE INVENTION

For example, on a vehicle apparatus or others, a component referred to as an electronic control unit (ECU) is mounted. The electronic control unit is provided with various semiconductor devices including a power-supply transistor or others, and supplies power to various loads represented by a headlight or others through a wire harness. The wire harness needs to have sufficient durability in accordance to the electric power that is required, and tends to cause increase in the total weight of the vehicle since many harnesses are mounted on various portions inside the vehicle apparatus.

On the other hand, among the electronic control units, there are some units that are provided with a protective function so as to detect various abnormalities such as short-circuits of loads and to execute an appropriate protective operation. Here, for example, if it takes time to detect the various abnormalities, a margin is required for the durability of the wire harness by the time. If so, there is a risk of further increase in the total weight of the vehicle.

An embodiment to be described below has been developed in view of such a situation, and other objects and novel characteristics of the present invention will be apparent from the description of the present specification and the accompanying drawings.

A semiconductor device according to one embodiment is provided with a first semiconductor chip and a second semiconductor chip mounted on one package and a load driving terminal. The first semiconductor chip includes: a power-supply transistor for supplying power to the load through the load driving terminal; a driver circuit for driving the power-supply transistor; a current detecting resistor for outputting a voltage in accordance with a flowing current to a first terminal; an abnormality detection circuit for detecting various abnormalities; and a current generation circuit. The current generation circuit generates a sense current on which a current flowing through the load driving terminal is reflected and a fault current indicating that the abnormality detection circuit has detected the abnormality, and allows either the sense current or the fault current to flow through the current detecting resistor depending on the presence or absence of the detection of the abnormality. The second semiconductor chip is provided with a storage circuit, an arithmetic processing circuit, and a first analog-digital conversion circuit that converts an analog signal to be input to the second terminal so as to be connected with the first terminal to a first digital signal. The storage circuit stores a current value of the fault current obtained by an inspection process of the semiconductor device as a determination reference value. The arithmetic processing circuit sets a standard range based on the determination reference value so that the presence or absence of the detection of the abnormality in the abnormality detection circuit is determined based on whether the current value indicated by the first digital signal is included within the standard range or not.

According to the above-described embodiment, various abnormalities can be detected at an early stage.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and others), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and others are mentioned, the substantially approximate and similar shapes and others are included therein unless otherwise stated or except the case where it is conceivable that they are apparently excluded in principle. The same goes for the numerical value and the range described above.

Moreover, although not particularly limited, a circuit element forming each of functional blocks of the present embodiment is formed on a semiconductor substrate made of a material such as single crystal silicon by using a publicly-known integrated circuit technique such as CMOS (complementary type MOS transistor). In the present embodiment, note that a MOSFET (Metal Oxide Semiconductor Field Effect Transistor) (abbreviated as MOS transistor) is used as one example of a MISFET (Metal Insulator Semiconductor Field Effect Transistor). However, a non-oxide film is not excluded from the use as a gate insulating film. Although the drawings do not clearly show connection of the MOS transistor to a substrate electric potential, the connection method is not particularly limited as long as the MOS transistor can normally operate.

Hereinafter, embodiments of the present invention will be described in detail based on the accompanying drawings. Note that the same components are denoted by the same reference symbols throughout all the drawings for describing the embodiments, and the repetitive description thereof will be omitted.

First Embodiment

<<Schematic Structure of Vehicle Apparatus>>

Figure 1:
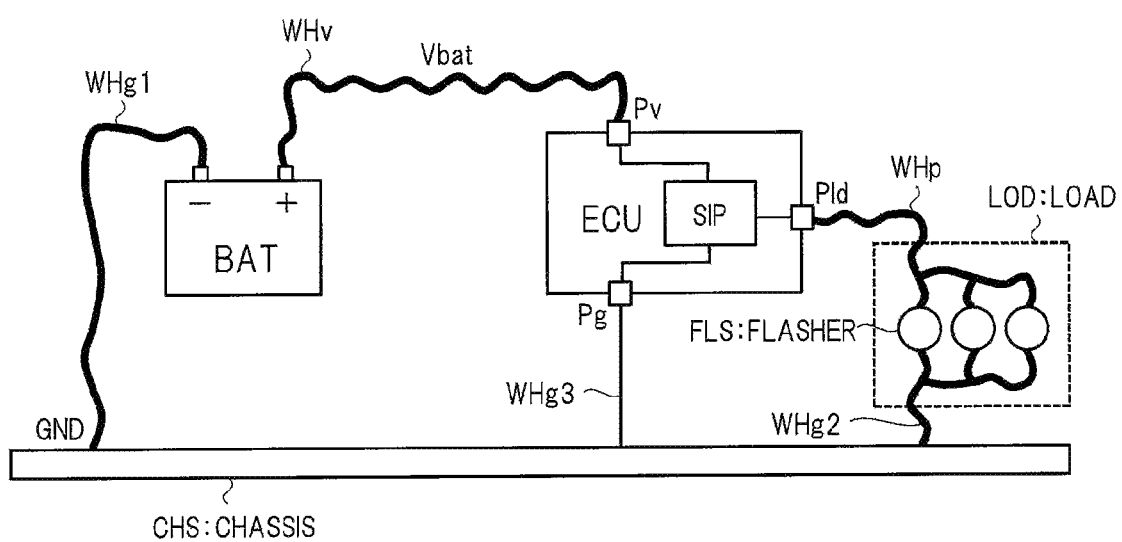
FIG. 1 is a schematic view showing a configuration example of a principal part in a vehicle apparatus according to a first embodiment of the present invention.

FIG. 1 is a schematic view showing a configuration example of a principal part in a vehicle apparatus according to a first embodiment of the present invention. The vehicle apparatus shown in FIG. 1 is provided with a chassis CHS, a battery BAT, an electronic control unit ECU, and a load LOD. The battery BAT generates a power supply, and generates a predetermined battery voltage Vbat (representatively 12V) taking the chassis CHS coupled thereto through a wire harness WHg1 as a ground power-supply voltage GND. In this example, the load LOD is constituted by three flashers FLS that are connected in parallel with one another. One end of each of the three flashers FLS is coupled to the ground power-supply voltage GND through a wire harness WHg2. The three flashers are attached to, for example, a left front portion, a left rear portion, a left side face portion or others of the vehicle apparatus, respectively.

The electronic control unit ECU is provided with power-supply connector terminals Pv and Pg, and a load-driving connector terminal Pld. The connector terminal Pv is coupled to the battery voltage Vbat through a wire harness WHv, and the connector terminal Pg is coupled to the ground power-supply voltage GND through a wire harness WHg3. Although described later in detail, the electronic control unit ECU is provided with a semiconductor device SIP formed in one package, and supplies power to the load LOD (the other ends of three flashers FLS) through the connector terminal Pld and a wire harness WHp coupled to the connector terminal Pld. More specifically, the electronic control unit ECU supplies power to the three flashers FLS when, for example, the vehicle apparatus turns left, and in response to this, all the three flashers FLS blink.

Here, for example, in the wire harnesses WHg1, WHv, WHp and WHg2, large currents which are required for the load LOD flow. Therefore, the diameters of the wire harnesses WHg1, WHv, WHp and WHg2 need to be thick as large as the large currents can sufficiently flow therein. On the other hand, in the wire harness WHg3, a small current required for the electronic control unit ECU (mainly the semiconductor device SIP) flows. Therefore, the diameter of the wire harness WHg3 may be as small as the small current can flow therein.

Figure 2A:
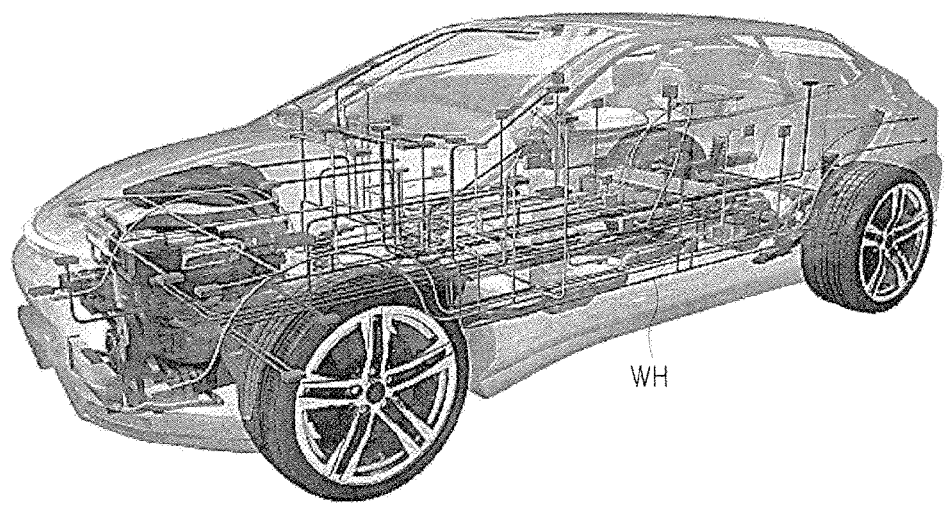
FIG. 2A and FIG. 2B are views showing an outer shape example of the vehicle apparatus including the configuration example of FIG. 1.
Figure 2B:
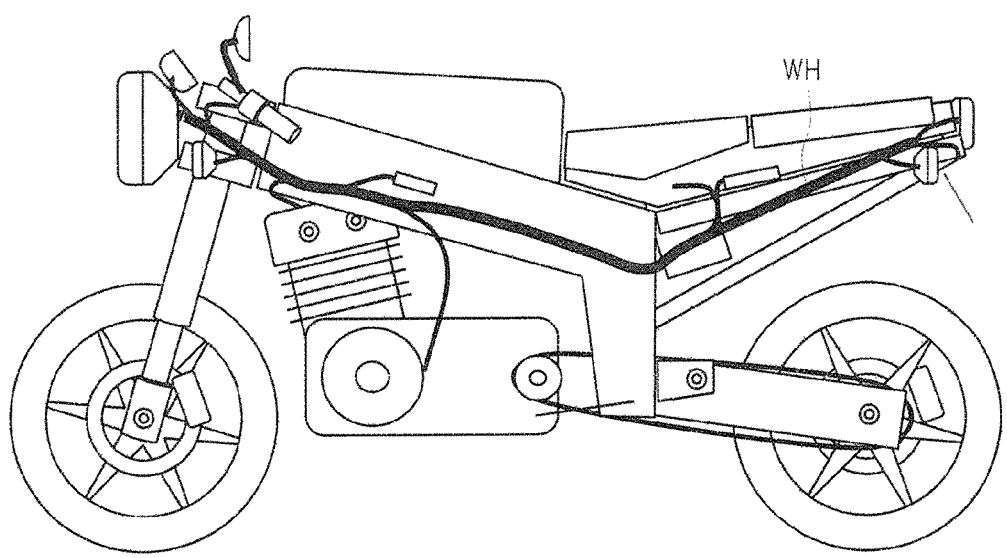

FIG. 2A and FIG. 2B are views showing outer shape examples of the vehicle apparatus including the configuration example of FIG. 1. FIG. 2A shows an outer shape example of an automobile, and FIG. 2B shows an outer shape example of a motor cycle. On such vehicle apparatuses (particularly automobile), not only the flashers FLS as shown in FIG. 1 but also many loads LOD including, for example, various illumination devices and various air conditioners or others are mounted. In accordance with the number of these loads LOD, the vehicle apparatus also mounts, many wire harnesses WH as shown in FIG. 2A and FIG. 2B. As a result, the wire harness WH (particularly wire harness with a thick diameter) causes the increase in the total weight of the vehicle apparatus.

Outline of Electronic Control Unit (Comparative Example) and Problems Thereof

Figure 16:
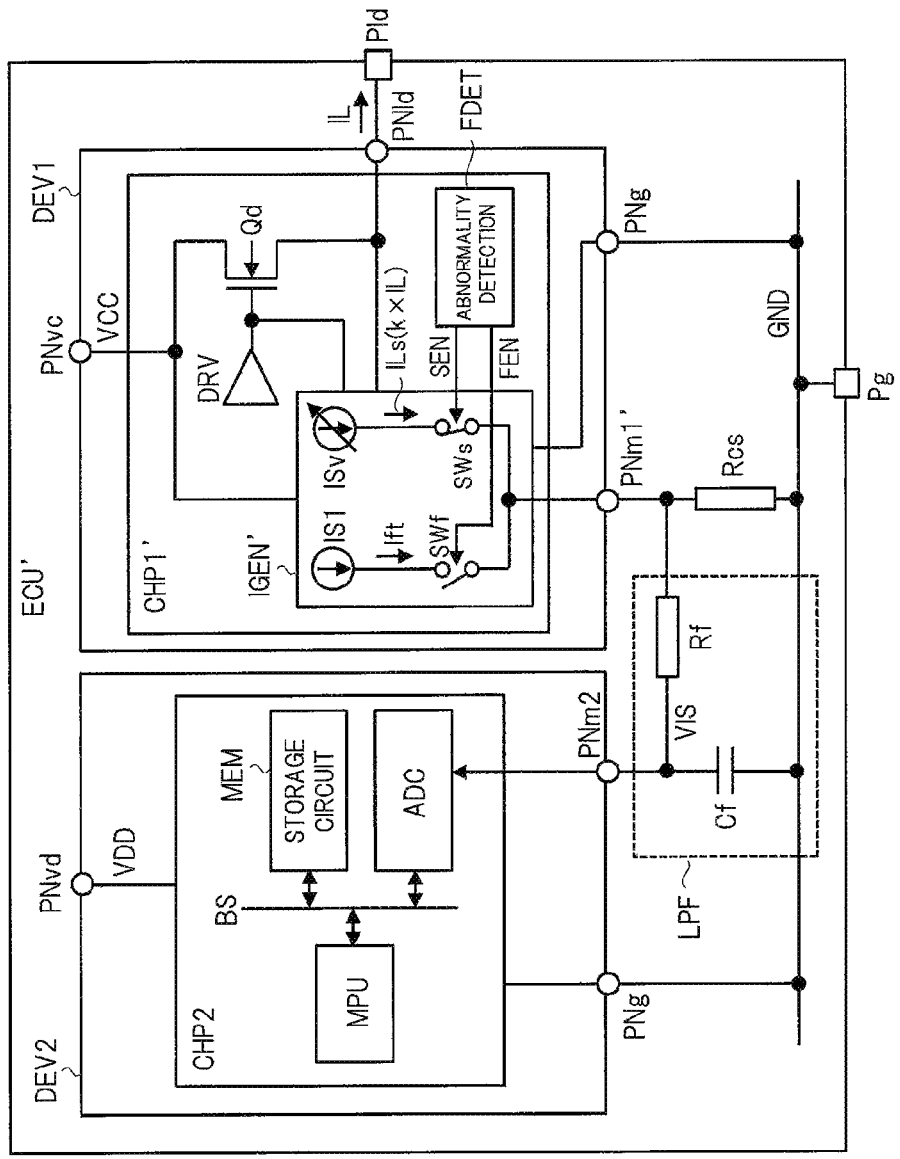
FIG. 16 is a circuit block diagram showing a schematic configuration example of a principal part in an electronic control unit studied as a comparative example of the present invention.

FIG. 16 is a circuit block diagram showing a schematic configuration example of a principal part in an electronic control unit studied as a comparative example of the present invention. An electronic control unit ECU' shown in FIG. 16 is constituted by a wiring substrate provided with the power-supply connector terminals Pv and Pg (illustration of Pv is omitted) and the load-driving connector terminal Pld shown in FIG. 1. The wiring substrate is provided with two semiconductor devices (packaged components) DEV1 and DEV2, a current detecting resistor Rcs, and a low-pass filter circuit LPF constituted by an LPF capacitor Cf and an LPF resistor Rf, which are mounted thereon.

The semiconductor device DEV1 is provided with external terminals PNvc, PNg, PNld and PNm1', and has a semiconductor chip CHP1' mounted thereon. The semiconductor chip CHP1' is provided with a power-supply transistor (here, nMOS transistor) Qd, a driver circuit DRV for driving the power-supply transistor Qd, a current generation circuit IGEN' and an abnormality detection circuit FDET. To the external terminal PNvc and external terminal PNg, the power-supply voltage VCC and the ground power-supply voltage GND are supplied, respectively. The power-supply voltage VCC is, for example, the battery voltage Vbat shown in FIG. 1 or others.

The power-supply transistor Qd has a drain to which the power-supply voltage VCC is supplied and a source coupled with the external terminal (load driving terminal) PNld. The external terminal PNld is coupled to the connector terminal Pld shown in FIG. 1 on the wiring substrate. The abnormality detection circuit FDET detects various abnormalities represented by overcurrent (load short-circuit), overtemperature, load open or others. If any of the various abnormalities is detected (in a case with any abnormality), the abnormality detection circuit FDET outputs a fault enable signal FEN. Moreover, if any of the various abnormalities is not detected (in a case without any abnormality), the abnormality detection circuit FDET outputs a sense enable signal SEN.

The current detecting resistor Rcs is coupled to the external terminal PNm1' so as to output a current monitor signal VIS having a voltage in accordance with a flowing current to the external terminal PNm1'. The current generation circuit IGEN' is provided with a variable current source ISv and a sense switch SWs, a constant current source IS1 and a fault switch SWf. The variable current source ISv allows a current to flow to the current detecting resistor Rcs through the sense switch SWs and the external terminal PNm1', and the constant current supply IS1 allows a current to flow to the current detecting resistor Rcs through the fault switch SWf and the external terminal PNm1'.

The variable current source ISv generates a sense current ILs to which a load current IL flowing through the load driving terminal PNld is reflected. The current value of the sense current ILs is defined to, for example, a value obtained by multiplying the load current IL by a coefficient (k) defined within a range from $\frac{1}{1000}$ to $\frac{1}{10000}$. The constant current source IS1 generates a fault current Ift having a fixed current value. The sense switch SWs is turned on during a period in which the abnormality detecting circuit FDET outputs the sense enable signal SEN, and the fault switch SWf is turned on during a period in which the abnormality detecting circuit FEDT outputs the fault enable signal FEN.

As a result, when the abnormality is not detected in the abnormality detection circuit FDET, the current generation circuit IGEN' allows the sense current ILs to flow through the current detecting resistor Rcs. When the abnormality is detected in the abnormality detection circuit FDET, it allows the fault current Ift to flow through the current detecting resistor Rcs. That is, the fault current Ift becomes a current indicating that the abnormality detection circuit FDET has detected the abnormality. In this manner, by using the configuration in which the sense current ILs or the fault current Ift is allowed to flow through the common external terminal PNm1', the number of external terminals can be reduced. However, for this reduction, it is required to make the two currents distinguishable. Therefore, the current value of the fault current Ift is defined to, for example, a value that is sufficiently higher than that of the sense current ILs in a normal state.

The semiconductor device DEV2 is provided with external terminals PNvd, PNg and PNm2, and has a semiconductor chip CHP2 mounted thereon. To the external terminal PNvd and external terminal PNg, a power-supply voltage VDD and the ground power-supply voltage GND are supplied, respectively. The power-supply voltage VDD is set to, for example, 3.3V, 5.0V or others, and is generated by, for example, dropping the battery voltage Vbat shown in FIG. 1.

The semiconductor chip CHP2 is, for example, a microcontroller (MCU: Micro Control Unit) chip or others, and has respective circuit blocks such as an arithmetic processing circuit MPU, a storage circuit MEM, and an analog-digital conversion circuit ADC, and buses BS for coupling the respective circuit blocks with one another. The analog-digital conversion circuit ADC converts a current monitor signal (analog signal) VIS input from the external terminal PNm1' to the external terminal PNm2 through the low-pass filter circuit LPF into a digital signal.

The arithmetic processing circuit MPU controls the semiconductor device DEV1 based on, for example, a predetermined control program stored in the storage circuit MEM. As one of its control functions, the arithmetic processing circuit MPU determines whether the abnormality is detected in the abnormality detection circuit FDET or not. More specifically, the control program sets a standard range of the fault current Ift that is, for example, previously figured out at a designing stage. The arithmetic processing circuit MPU determines whether the abnormality is detected in the abnormality detection circuit FDET or not based on whether a current value represented by the digital signal from the analog-digital conversion circuit ADC is included in the standard range or not. Moreover, if the presence of the abnormality detection is determined, the arithmetic processing circuit MPU executes an appropriate protective operation (for example, turning off the power-supply transistor Qd or others) based on the control program.

Figure 17A:
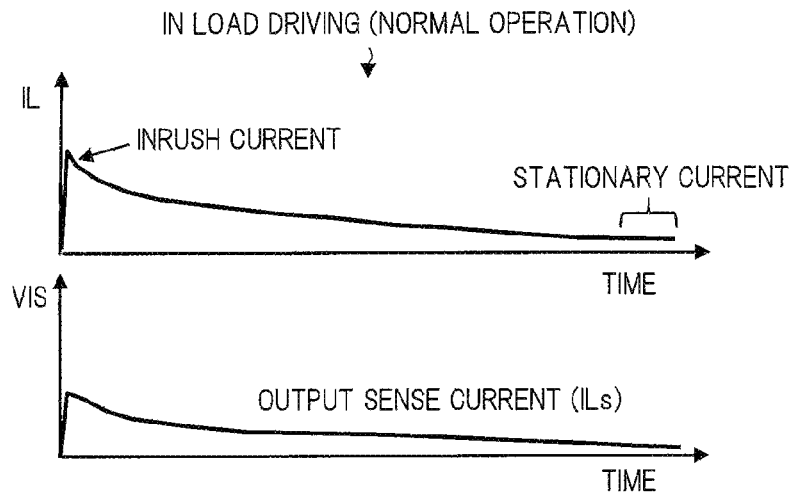
FIG. 17A, FIG. 17B and FIG. 17C are schematic views showing a principal operation of the electronic control unit of FIG. 16.
Figure 17B:
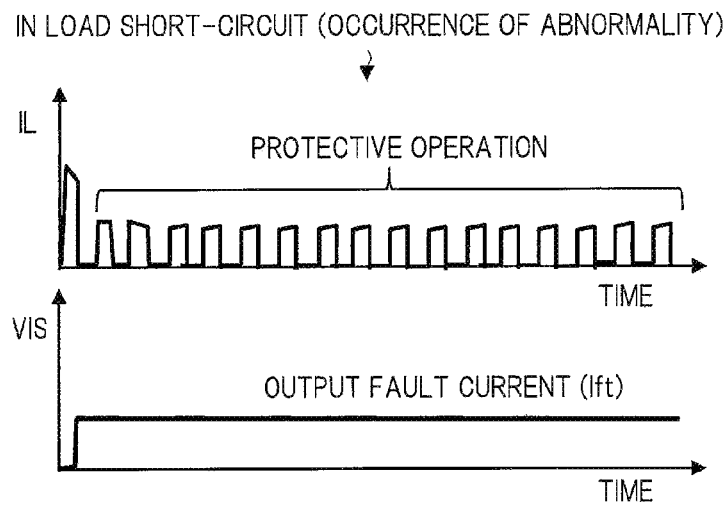
Figure 17C:
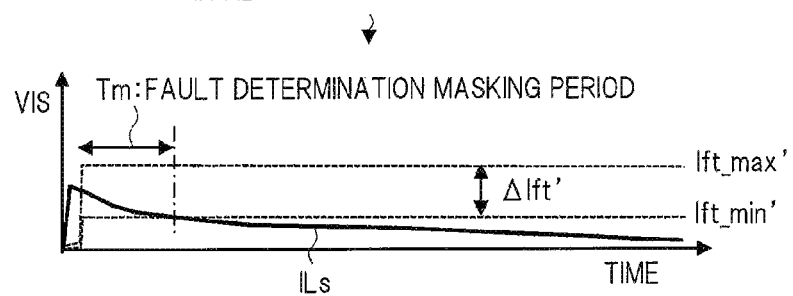

FIG. 17A, FIG. 17B and FIG. 17C are schematic views showing a principal operation example of the electronic control unit of FIG. 16. FIG. 17A shows an operation in a case of occurrence of no particular abnormality after the start of a power supply to the load LOD, no is particularly present. For example, in the load LOD represented by the flasher FLS, the headlight and others shown in FIG. 1, an inrush current flows in accordance with characteristics of a filament or others at an initial stage after the start of the power supply as shown in FIG. 17A. Due to the inrush current, the load current IL sometimes becomes, for example, about several tens A to several hundreds A. In this case, the sense current ILs sometimes becomes, for example, about several mA to several tens mA. Then, the load current IL is converged to a constant current of, for example, about several A, and the sense current ILs is also converged to about 1 mA or less.

On the other hand, for example, if the abnormality such as a load short-circuit occurs, an excessive load current IL flows. In an example of FIG. 17B, if such an excessive current is detected by using the abnormality detection circuit FDET, the semiconductor device DEV1 executes such a protective operation as controlling the load current IL by, for example, controlling the power-supply transistor Qd to turn on intermittently or others. Moreover, the semiconductor device DEV1 controls the fault switch SWf to turn on (the sense switch SWs to turn off) by using the abnormality detection circuit FDET. Thus, the semiconductor device DEV1 outputs a current monitor signal VIS having a voltage in accordance with the fault current Ift so as to inform the semiconductor device DEV2 of the detection of the abnormality in the abnormality detection circuit FDET.

FIG. 17C shows a state in which FIG. 17A and FIG. 17B are overlapped with each other. As described above, the current value of the fault current Ift is set to a value (for example, about several mA) sufficiently larger than that of the constant current so as not to overlap with the sense current (for example, 1 mA or less) in the normal state. On the other hand, as shown in FIG. 17C, a standard range ΔIft' to be used when the arithmetic processing circuit MPU determines the fault current Ift is set to a range obtained by adding a margin based on the designed value of the fault current Ift as the standard. This margin is set by taking production variation of the constant current source IS1 for each of the semiconductor chips CHP1', the temperature dependence of each constant current source IS1, and variation of the current detecting resistor Rcs for each of the electronic control units ECU', or others into consideration, and is required to have a certain degree.

Here, as shown in FIG. 17C, the occurrence of the inrush current has a case in which a sense current ILs of several mA or others flows, and therefore, a period in which the sense current ILs overlaps with the standard range ΔIft' of the fault current Ift may be caused. Until this inrush current is smaller than the lower limit value Ift_min' of the standard range ΔIft', the arithmetic processing circuit MPU cannot correctly determine the presence of absence of the abnormality. For this reason, as shown in FIG. 17C, the arithmetic processing circuit MPU needs to determine the presence or absence of the abnormality after elapse of a fault determination masking period Tm, and therefore, it takes time to start the determination. As a result, since the timing at which the arithmetic processing circuit MPU starts the protective operation is also delayed, there is a risk of damage of the various components or others.

On the other hand, when the load short-circuit actually occurs, the state of the load short-circuit continues during at least the fault determination masking period Tm, and the wire harness WH needs to have such durability as to prevent damages such as generation of smoke or others even in this state. As a result, the diameter of the wire harness WH needs to be thicker as the fault determination masking period Tm is longer, and therefore, the weight of the wire harness WH increases. Particularly, the number of mounting electronic components (that is, loads LOD) on the automobile or others has continuously increased, and accordingly, the total weight of the wire harnesses WH coupled to the electronic components reaches several tens kg even in a popular car in some cases. The increase in the total weight of the harnesses WH causes demerits in view of a fuel economy performance and a cost. Therefore, it is beneficial to use a system of the first embodiment to be described below.

Configuration of Electronic Control Unit (First Embodiment)

Figure 3:
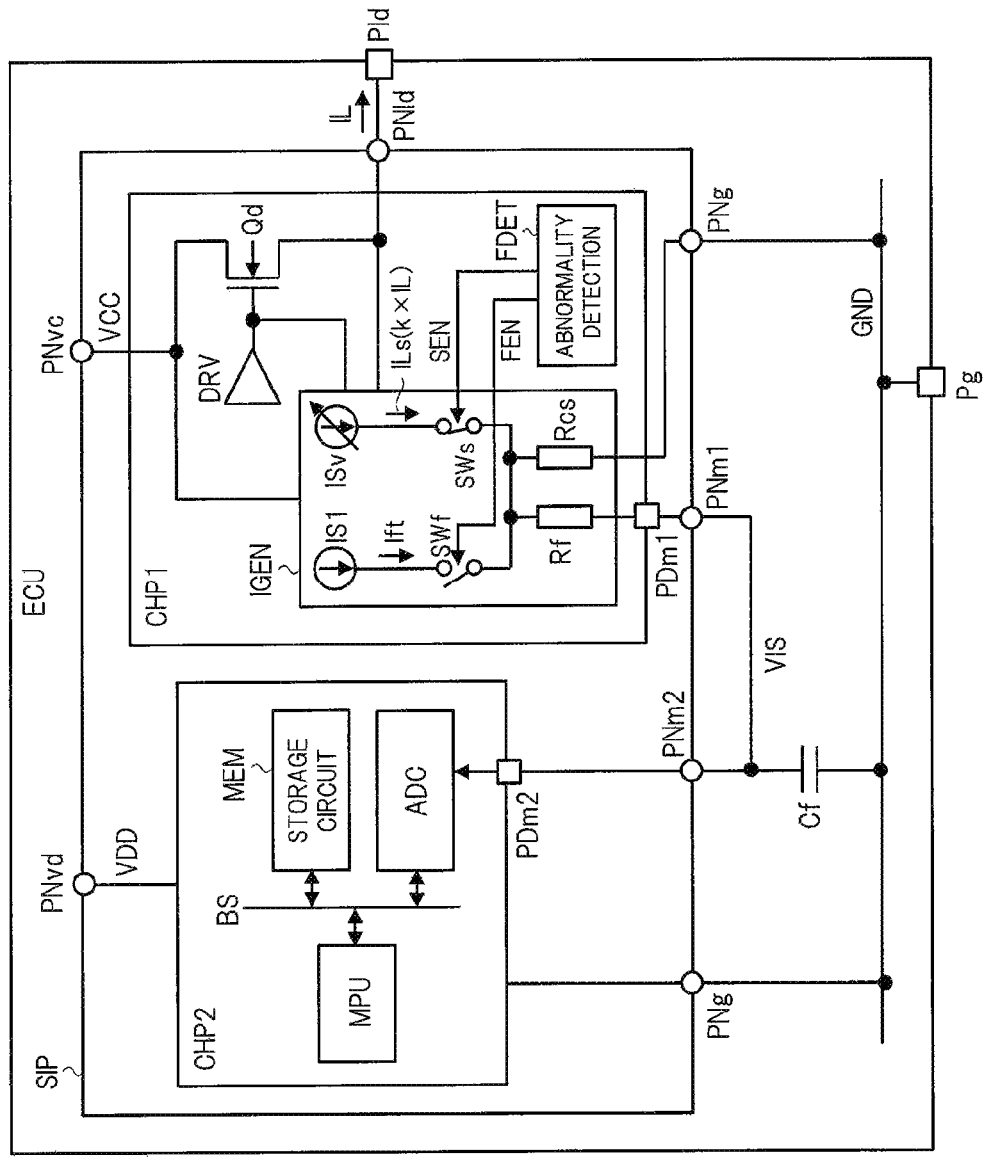
FIG. 3 is a circuit block diagram showing a schematic configuration example of a principal part in an electronic control unit according to the first embodiment of the present invention.
Figure 4:
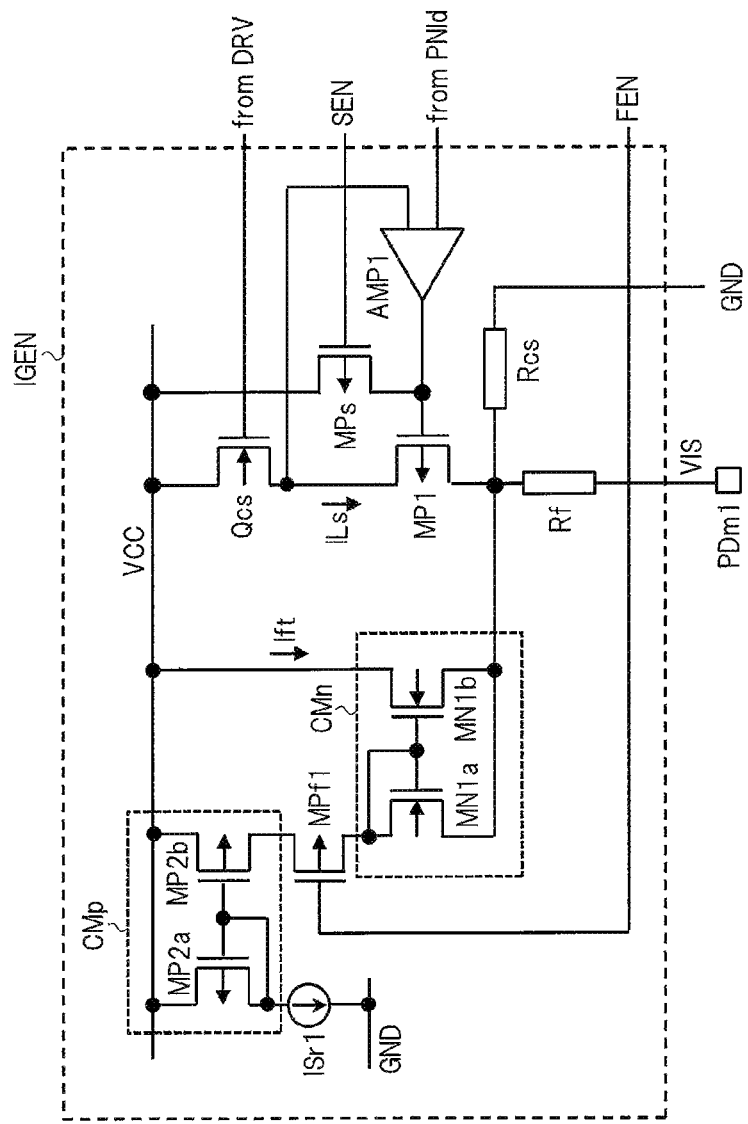
FIG. 4 is a circuit diagram showing a configuration example of a current generation circuit in FIG. 3.

FIG. 3 is a circuit block diagram showing a schematic configuration example of a principal part in an electronic control unit according to the first embodiment of the present invention. FIG. 4 is a circuit diagram showing a configuration example of a current generation circuit in FIG. 3. An electronic control unit ECU shown in FIG. 3 is constituted by, for example, a wiring substrate provided with the power-supply connector terminals Pv and Pg (illustration of Pv is omitted) and the load-driving connector terminal Pld shown in FIG. 1. As different from the case of FIG. 16, one semiconductor device (packaged component) SIP and an LPF capacitor Cf are mounted on the wiring substrate.

The semiconductor device SIP is provided with external terminals PNvc, PNvd, PNg, PNld, PNm1 and PNm2, and has two semiconductor chips CHP1 and CHP2 mounted thereon. As similar to the case of FIG. 16, the power-supply voltages VCC and VDD, and the ground power-supply voltage GND are supplied to the external terminals PNvc and PNvd, and the external terminal PNg, respectively. The semiconductor chip CHP1 is provided with a power-supply transistor Qd, a driver circuit DRV and an abnormality detection circuit FDET, which are the same as those of the semiconductor chip CHP1' of FIG. 16, and besides, provided with an electrode pad (terminal) PDm1 and a current generation circuit IGEN which is different from FIG. 16. The electrode pad PDm1 is coupled to the external terminal PNm1.

In addition to the variable current source ISv, the sense switch SWs, the constant current source IS1 and the fault switch SWf as similar to the case of FIG. 16, the current generation circuit IGEN is provided with a current detecting resistor Rcs and an LPF resistor Rf. That is, although the current detecting resistor Rcs and the LPF resistor Rf are provided outside the semiconductor device in FIG. 16, they are provided in the semiconductor chip CHP1 inside the semiconductor device SIP in FIG. 3. One end of the current detecting resistor Rcs is coupled to the external terminal PNg, and the other end thereof is coupled to the sense switch SWs and the fault switch SWf and is also coupled to the electrode pad PDm1 through the LPF resistor Rf.

More specifically, the current generation circuit IGEN is provided with, for example, a circuit configuration shown in FIG. 4. In FIG. 4, a sensing transistor (for example, nMOS transistor) Qcs, a pMOS transistor MP1 and an amplifier circuit AMP1 constitute the variable current source ISv of FIG. 3, and a pMOS transistor MPs constitutes the sense switch SWs of FIG. 3. The sensing transistor Qcs is configured with a transistor size which is predetermined times (for example, 1/1000 to 1/10000 times, etc.) a size of the power-supply transistor Qd, and has a gate and a drain coupled in common with the gate and drain of the power-supply transistor Qd.

A source of the pMOS transistor MP1 is coupled to the source of the sensing transistor Qcs, and a drain thereof is coupled to the ground power-supply voltage GND through the current detecting resistor Rcs. The amplifier circuit AMP1 uses the source of the sensing transistor Qcs and the source of the power-supply transistor Qd as input terminals, and controls the gate of the pMOS transistor MP1 so that both source voltages are equal to each other. As a result, the sensing transistor Qcs is driven in parallel with the power-supply transistor Qd by the driver circuit DRV at a voltage between the gate and source electrodes which is equal to that of the power-supply transistor Qd. A source and a drain of the pMOS transistor MPs are coupled with the power-supply voltage VCC and the gate of the pMOS transistor MP1, respectively.

The pMOS transistor MPs is controlled to be turned ON during a period in which the sense enable signal SEN is not output (here, 'L' level period) so as to fix the pMOS transistor MP1 to be turned OFF. On the other hand, the pMOS transistor MPs is controlled to be turned OFF during a period in which the sense enable signal SEN is output (here, 'H' level period). In this case, the sensing transistor Qcs allows a sense current ILs (that is, a current generated based on a transistor-size ratio) on which the load current IL flowing through the power-supply transistor Qd is reflected to flow to the current detecting resistor Rcs through the pMOS transistor MP1. As a result, to the electrode pad (terminal) PDm1 and the external terminal PNm1, a voltage on which the load current IL flowing through the external terminal (load driving terminal) PNld is reflected is output as a current monitor signal VIS.

Moreover, in FIG. 4, a constant current source ISr1 and current mirror circuits CMp and CMn constitute the constant current source IS1 of FIG. 3, and the pMOS transistor MPf1 constitutes the fault switch SWf of FIG. 3. The current mirror circuit CMp is provided with pMOS transistors MP2a and MP2b, and allows a current from the constant current source ISr1 input to the pMOS transistor MP2a to flow through the pMOS transistor MP2b based on the transistor size ratio. The current mirror circuit CMn is provided with nMOS transistors MN1a and MN1b, and allows a current input to the nMOS transistor MN1a to flow through the nMOS transistor MN1b based on the transistor size ratio. The nMOS transistor MN1b allows the current to flow through the current detecting resistor Rcs as the fault current Ift.

A source and a drain of the pMOS transistor MPf1 is coupled to the drain of the pMOS transistor MP2b and the drain of the nMOS transistor MN1a, respectively. The pMOS transistor MPf1 is controlled to be turned ON during a period in which the fault enable signal FEN is output (defined here as 'L' level period). As a result, the fault current Ift flows through the current detecting resistor Rcs. On the other hand, the pMOS transistor MPf1 is controlled to be turned OFF during a period in which the fault enable signal FEN is not output (defined here as 'H' level period). As a result, the nMOS transistor MN1b does not allow the current to flow.

The current detecting resistor Rcs generates a voltage that is proportional to either the sense current ILs or the fault current Ift in accordance with the sense enable signal SEN and the fault enable signal FEN, and outputs the voltage (that is, current monitor signal VIS) to the electrode pad PDm1 through the LPF resistor Rf. Although not particularly limited, the current detecting resistor Rcs and the LPF resistor Rf are formed by a polysilicon layer, a diffusion layer or others on the silicon substrate.

Referring back to FIG. 3, the external terminal PNm1 is coupled to, for example, the external terminal PNm2 through a wire on the wiring substrate of the electronic control unit ECU outside the semiconductor device SIP. To the external terminal PNm1 and external terminal PNm2, the LPF capacitor Cf is coupled on the wiring substrate. As a result, to the external terminal PNm2, the current monitor signal VIS that has been smoothed by the low-pass filter circuit (LPF) constituted by the LPF resistor Rf and the LPF capacitor Cf inside the semiconductor chip CHP1 is input.

The semiconductor chip CHP2 is, for example, a microcontroller (MCU) chip or others, and is provided with respective circuit blocks, such as the arithmetic processing circuit MPU, the storage circuit MEM and analog-digital conversion circuit ADC or others, and a bus BS for coupling these respective circuit blocks with one another as similar to the case of FIG. 16. Moreover, here, the semiconductor chip CHP2 is provided with an electrode pad (terminal) PDm2. The electrode pad PDm2 is coupled to the external terminal PNm2.

The electrode pad PDm2 is a terminal for use in coupling to the electrode pad (terminal) PNm1 of the semiconductor chip CHP1. In the example of FIG. 3, by coupling the external terminal PNm1 and the external terminal PNm2 with each other, the electrode pad PDm2 is coupled to the electrode pad PDm1 through these external terminals. However, depending on cases, the electrode pad PDm2 and the electrode pad PDm1 may be directly connected with each other inside the semiconductor device SIP. The analog-digital conversion circuit ADC converts the current monitor signal VIS (analog signal) input to the electrode pad PDm2 into a digital signal.

Here, although described in detail later, the storage circuit MEM of the semiconductor chip CHP2 stores the current value of the fault current Ift obtained in the inspection process for the semiconductor device SIP as a determination reference value. Moreover, the arithmetic processing circuit MPU sets a standard range based on the determination reference value, and determines the presence or absence of the detection of the abnormality in the abnormality detection circuit FDET inside the semiconductor chip CHP1, based on whether or not the current value indicated by the digital signal from the analog-digital conversion circuit ADC is included inside the standard range.

<<Method of Inspecting Semiconductor Device>>

Figure 5A:
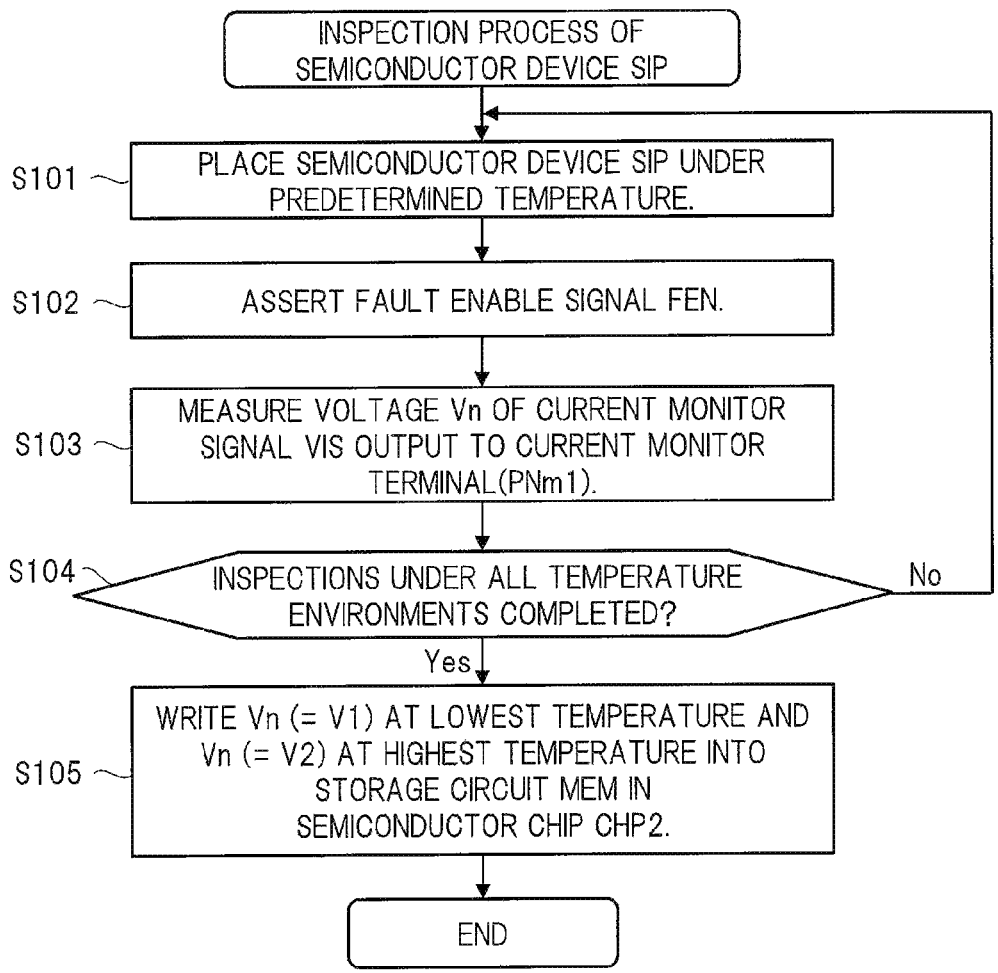
FIG. 5A is a flowchart showing one example of an inspection process for the semiconductor device of FIG. 3
Figure 5B:
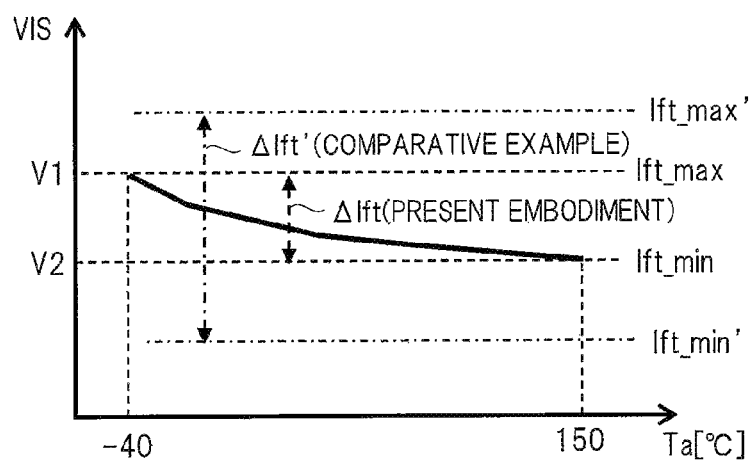
FIG. 5B is a supplemental view of FIG. 5A.

FIG. 5A is a flowchart showing one example of an inspection process for the semiconductor device of FIG. 3, and FIG. 5B is a supplemental view of FIG. 5A. In FIG. 5A, in a predetermined inspection device, a semiconductor device SIP is placed under a predetermined temperature first (step S101). Next, the inspection device asserts the fault enable signal FEN (step S102). More specifically, for example, a system is proposed, the system having a circuit for a test provided to the semiconductor chip CHP1 and allowing the inspection device to issue a command for asserting the fault enable signal FEN toward the circuit for the test through an external terminal. Moreover, depending on cases, another system may be applicable, the system allowing the abnormality detection circuit FEDT to assert the fault enable signal FEN by applying an excessive current or others to the external terminal PNld of the semiconductor device SIP.

Successively, in the state in which the fault enable signal FEN is asserted, the inspection device measures the voltage Vn of the current monitor signal VIS output to the external terminal PNm1 serving as a current monitor terminal (step S103). Then, the inspection device repeats the measurements from step S101 to step S103 under predetermined all temperature environment (step S104). After completion of the measurements under all the temperature environments, the inspection device writes a voltage Vn (set to V1) at the time of the lowest temperature and a voltage Vn (set to V2)

at the time of the highest temperature into the storage circuit MEM in the semiconductor chip CHP2 (step S105).

In an example in FIG. 5B, a voltage V1 at −40° C. and a voltage V2 at 150° C. are written into the storage circuit MEM. The voltage V1 is a voltage corresponding to the upper limit value Ift_max of the fault current Ift, and the voltage V2 is a voltage corresponding to the lower limit value Ift_min of the fault current Ift. For example, by using the voltage V1 (upper limit value Ift_max) and the voltage V2 (lower limit value Ift_min) as the respective determination reference values, the arithmetic processing circuit MPU can set a range between the two determination reference values as the standard range ΔIft.

Here, for example, the standard range ΔIft' in the case of usage of the configuration shown in FIG. 16 becomes such a range as to add a margin to the originally-required minimum range in summary. That is, in the case of usage of the configuration of FIG. 16, the originally-required minimum range cannot be clarified since various variation amounts are unclear, and therefore, it is required for the standard range ΔIft' to add the margin obtained by estimating the various variation amounts at the maximum.

More specifically, production variations for each of the semiconductor chips CHP1 and current variations caused by the temperature dependence, or others occur in the constant current source IS1 of FIG. 3, and production variations for each of the semiconductor chips CHP1 and current variations caused by the temperature dependence, or others occur even in the current detecting resistor Rcs. In the configuration shown in FIG. 4, the variations in the constant current source IS1 correspond to production variations in the constant current source ISr1, production variations in the current mirror circuits CMp and CMn (variations in the transistor size ratio) and current variations caused by the temperature dependence of these elements. In the configuration shown in FIG. 16, it is required to estimate the maximum amounts for these respective various variations at the designing stage, and add such a margin as to be obtained by adding all the estimated maximum amounts into the standard range ΔIft'.

On the other hand, in a case of usage of the system of the present first embodiment, the originally-required minimum range can be clarified since actual measurement results (in other words, the various variation amounts) have been confirmed, so that the standard range ΔIft not including the margin can be set. At this time, in the configuration of FIG. 3, since the current detecting resistor Rcs is mounted on the semiconductor device SIP as different from the configuration of FIG. 16, not only the variations in the constant current source IS1 but also the variations in the current detecting resistor Rcs are reflected on the actual measurement results. As a result, the width of the standard range ΔIft can be significantly narrowed more than that of the standard range ΔIft'. Note that the arithmetic processing circuit MPU sets the standard range ΔIft by using the actual measurement results as they are here. However, the standard range ΔIft may be set by adding a minute margin corresponding to the measurement error thereto.

<<Abnormality Determination Method by Arithmetic Processing Circuit>>

Figure 6A:
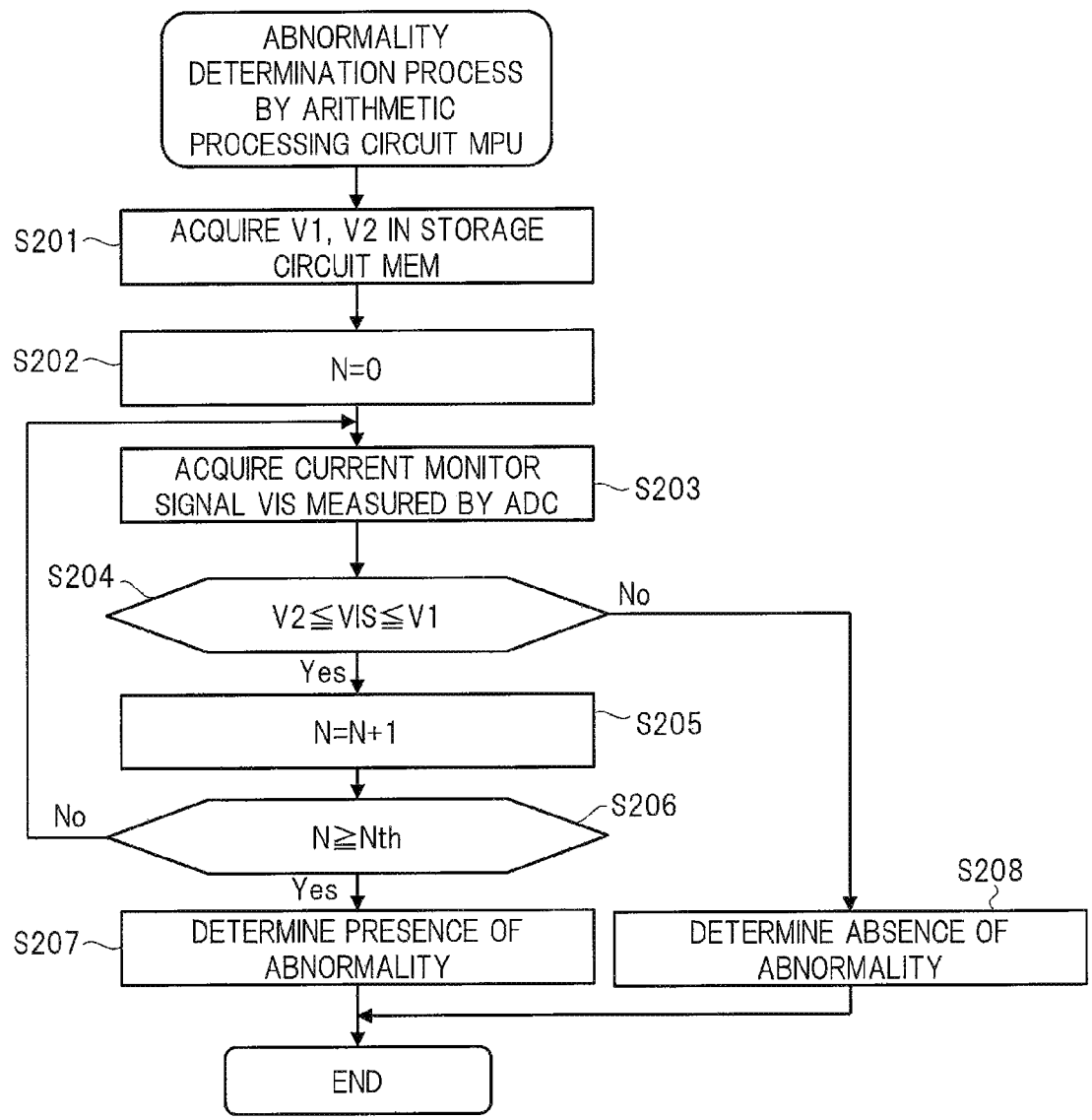
FIG. 6A is a flowchart showing one example of processing contents at the time of execution of abnormality determination by an arithmetic processing circuit in the semiconductor device of FIG. 3
Figure 6B:
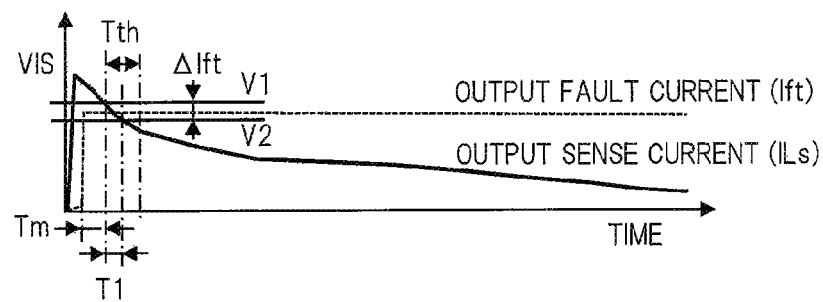
FIG. 6B is a supplemental view of FIG. 6A.

FIG. 6A is a flowchart showing one example of processing contents to be used when the arithmetic processing circuit executes the abnormality determination in the semiconductor device of FIG. 3, and FIG. 6B is a supplemental view of FIG. 6A. In FIG. 6A, the arithmetic processing circuit MPU acquires voltages V1 and V2 stored in the storage circuit MEM first (step S201). Next, after the arithmetic processing circuit MPU sets the number of times N to 0 (step S202), the arithmetic processing circuit MPU acquires a voltage value (digital signal) of the current monitor signal VIS measured by the analog-digital conversion circuit ADC (step S203). The analog-digital conversion circuit ADC is supposed to regularly perform measurements at, for example, a predetermined sampling frequency.

Successively, the arithmetic processing circuit MPU determines whether or not the voltage value of the current monitor signal VIS is included within the range between the voltage V1 and voltage V2 (that is, within the standard range ΔIft) (step S204). If it is not included within the standard range ΔIft, the arithmetic processing circuit MPU determines that no abnormality has been detected (step S208). On the other hand, if it is included within the standard range ΔIft, the arithmetic processing circuit MPU increments the number of times N (step S205), and then, determines whether or not the number of times N has reached a predetermined threshold value number of times Nth (step S206).

If the number of times N has not reached the threshold value number of times Nth, the arithmetic processing circuit MPU repeats processes of steps S203 to S205. On the other hand, if the number of times N has reached the threshold value number of times Nth, the arithmetic processing circuit MPU determines that the abnormality has been detected (step S207). By using these processes, the arithmetic processing circuit MPU determines the presence or absence of the abnormality based on whether or not the current value indicated by the digital signal from the analog-digital conversion circuit ADC is continuously included within the standard range ΔIft for a predetermined period (that is, a period determined based on the threshold number of times Nth).

In the example in FIG. 6B, the arithmetic processing circuit MPU determines whether or not the voltage of the current monitor signal VIS caused based on the sense current ILs is included within the standard range ΔIft composed of the voltage (determination reference value) V1 and the voltage (determination reference value) V2 for the period Tth or longer. The voltage of the current monitor signal VIS is included only for a period T1 shorter than the period Tth as shown in FIG. 6B in the absence of the detection of abnormality, while it is included for a period longer than the period Tth in the presence of the detection of the abnormality. When such a process is used, the fault determination masking period Tm described in FIG. 17C is automatically set as the shortest time in accordance with the standard range ΔIft.

Note that the processing contents of the arithmetic processing circuit MPU are not particularly limited to such a system, and various systems can be used. For example, a system or others may be proposed, the system allowing a user to set a minimally-required fault determination masking period Tm based on characteristic information of the inrush current in accordance with the used load LOD and the lower limit value (here, voltage V2) of the fault current Ift stored in the storage circuit MEM, and the system reflecting the period on a predetermined control program. In this case, at the initial stage of driving the load, the arithmetic processing circuit MPU controls the power-supply transistor Qd to turn on based on the control program, and then, executes processes for performing the abnormality determination process after a lapse of the fault determination masking period Tm.

<<Package Configuration of Semiconductor Device>>

Figure 7:
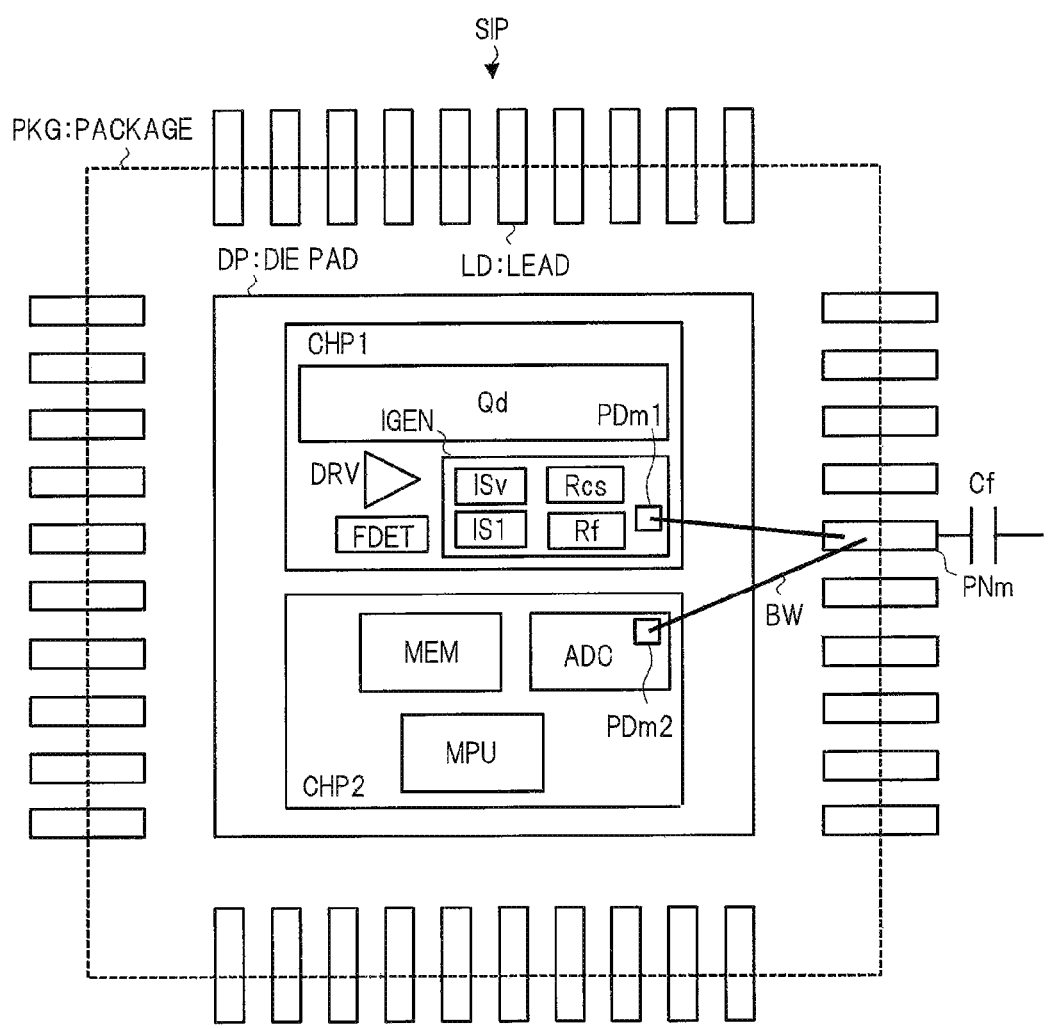
FIG. 7 is a plan view showing an outer shape example of a principal part of the semiconductor device of FIG. 3.

FIG. 7 is a plan view showing a schematic outer shape example of a principal part of the semiconductor device of FIG. 3. The semiconductor device SIP shown in FIG. 7 is a package component in which two semiconductor chips CHP1 and CHP2 are mounted on one package. In FIG. 7, a die pad DP is provided inside the package (package resin) PKG, and a plurality of leads LD to be external terminals are provided on an outer peripheral portion of the package PKG. Moreover, on the die pad DP, the two semiconductor chips CHP1 and CHP2 are mounted.

Here, in the semiconductor device SIP of FIG. 7, as different from the semiconductor device SIP shown in FIG. 3, a wiring for use in connecting the electrode pad PDm1 of the semiconductor chip CHP1 with the electrode pad PDm2 of the semiconductor chip CHP2 is provided inside the package PKG. In this example, the electrode pads PDm1 and PDm2 are coupled to the same lead LD (here, an external terminal PNm to be the current monitor terminal) through a bonding wire BW. To the external terminal PNm, the LPF capacitor Cf can be connected.

<<Wiring Substrate Configuration of Electronic Control Unit>>

Figure 8:
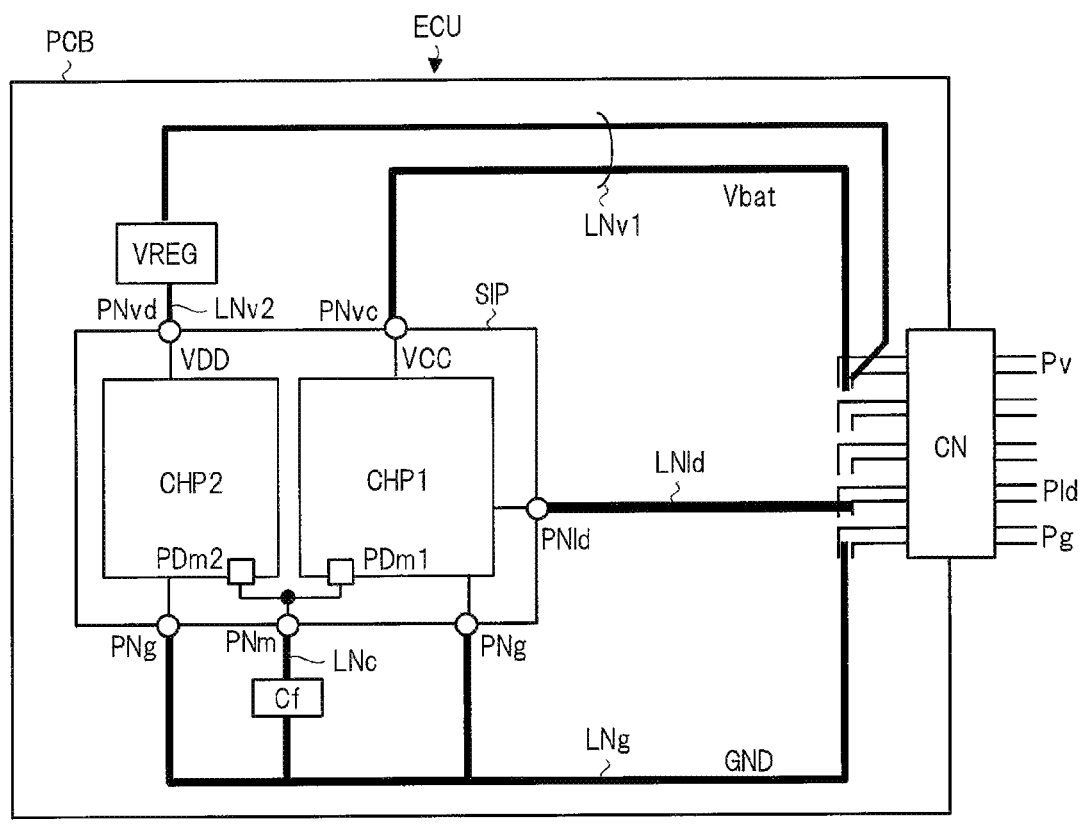
FIG. 8 is a circuit block diagram showing a schematic configuration example of a principal part of the electronic control unit provided with the semiconductor device of FIG. 7.

FIG. 8 is a circuit block diagram showing a schematic configuration example of a principal part of an electronic control unit provided with the semiconductor device of FIG. 7. The electronic control unit ECU shown in FIG. 8 is constituted by a wiring substrate PCB on which a connector CN is mounted. The connector CN is provided with the power-supply connector terminals Pv and Pg shown in FIG. 1, and a load-driving connector terminal Pld. On the wiring substrate PCB, one semiconductor device (package component) SIP and the LPF capacitor Cf are mounted, in the same manner as in the case of FIG. 3, and besides, a power-supply regulator device VREG is also mounted.

On the wiring substrate PCB, a wiring LNv1 for the battery voltage Vbat, a wiring LNv2 for the power-supply voltage VDD, a wiring LNld for driving a load, a wiring LNg for the ground power-supply voltage GND and a wiring LNc for the LPF capacitor Cf are formed. One end of the wiring LNv1 is coupled to the connector terminal Pv, and the other end thereof is coupled to the external terminal PNvc of the semiconductor device SIP and the power supply regulator device VREG. The power supply regulator device VREG drops the battery voltage Vbat (for example, 12V or others) output from the wiring LNv1 down to a power-supply voltage VDD such as 3.3V. Moreover, the power supply regulator device VREG supplies the power-supply voltage VDD to the external terminal PNvd of the semiconductor device SIP through the wiring LNv2.

One end of the wiring LNld is coupled to the connector terminal Pld for driving a load, and the other end thereof is coupled to the external terminal (load driving terminal) PNld of the semiconductor device SIP. One end of the wiring LNg is coupled to the connector terminal Pg, and the other end thereof is coupled to the external terminal PNg of the semiconductor device SIP and one end of the LPF capacitor Cf. The other end of the LPF capacitor Cf is coupled to the external terminal (current monitor terminal) PNm of the semiconductor device SIP through a wiring LNc.

When the semiconductor device SIP as shown in FIG. 7 and the electronic control unit ECU as shown in FIG. 8 are used, the electrode pads PDm1 and PDm2 are coupled to each other outside the semiconductor device SIP in FIG. 3. However, in FIG. 7, they are coupled to each other inside the semiconductor device SIP. Thus, the two external terminals PNm1 and PNm2 in FIG. 3 can be concentrated as one external terminal PNm shown in FIG. 7, so that the number of the external terminals can be reduced. Moreover, accordingly, the wiring for coupling the two external terminals PNm1 and PNm2 to each other becomes unnecessary in the electronic control unit ECU of FIG. 8. Therefore, for example, the assembly costs or others in a parts assembly manufacturer can be reduced.

However, in the case of FIG. 7, the analog-digital conversion circuit ADC inside the semiconductor chip CHP2 that detects a current is always specified. That is, the semiconductor chip (for example, micro-controller chip) CHP2 is normally provided with a plurality of analog-digital conversion circuits, and therefore, it becomes difficult for the parts assembly manufacturer to optionally set an analog-digital conversion circuit for use in performing the current detection among the plurality of circuits. Consequently, depending on cases, the configuration shown in FIG. 3 is more desirable in some cases. Moreover, here, although the LPF capacitor Cf is prepared as an external component of the semiconductor device SIP because it generally has a large size, it can be also mounted into the semiconductor device SIP depending on cases. In this case, the external terminal PNm in FIGS. 7 and 8 can be eliminated.

<<Details of Abnormality Detection Circuit>>

Figure 18A:
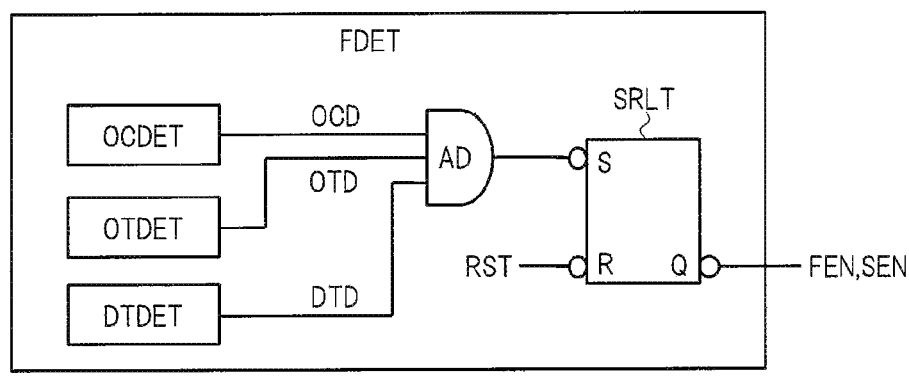
FIG. 18A is a schematic view showing a configuration example of the abnormality detection circuit in FIG. 3.
Figure 18B:
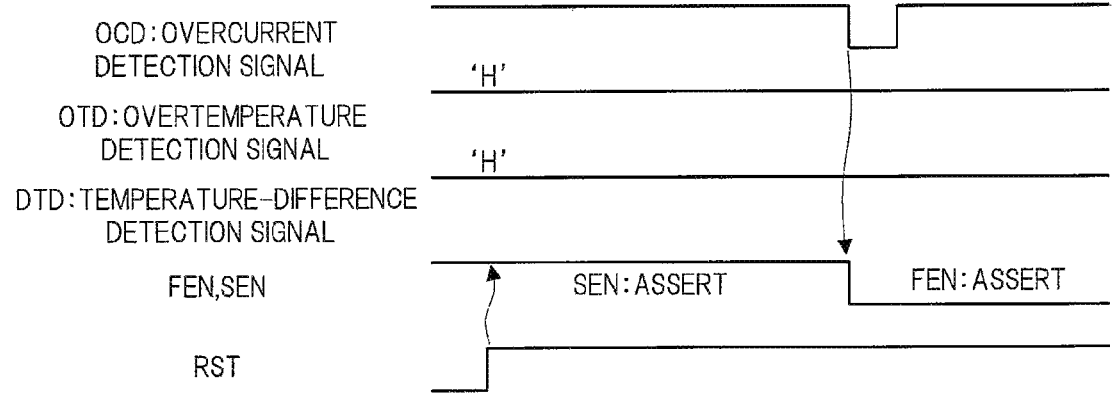
FIG. 18B is a waveform diagram showing an operation example of FIG. 18A.

FIG. 18A is a schematic view showing a configuration example of the abnormality detection circuit in FIG. 3, and FIG. 18B is a waveform diagram showing an operation example of FIG. 18A. An abnormality detection circuit FDET shown in FIG. 18A is provided with an overcurrent detection circuit OCDET, an overtemperature detection circuit OTDET, a temperature-difference detection circuit DTDET, an AND operation circuit AD and an SR latch circuit SRLT. When the overcurrent detection circuit OCDET detects that an overcurrent has flowed through the power-supply transistor Qd, the overcurrent detection circuit OCDET asserts an overcurrent detection signal OCD. When the overtemperature detection circuit OTDET detects that the absolute temperature of the power-supply transistor Qd has exceeded a predetermined temperature, the overtemperature detection circuit OTDET asserts an overtemperature detection signal OTD. When the temperature-difference detection circuit DTDET detects that the temperature of the power-supply transistor Qd has been rapidly raised, the temperature-difference detection circuit DTDET asserts a temperature-difference detection signal DTD.

When even any one of the overcurrent detection signal OCD, the overtemperature detection signal OTD and the temperature-difference detection signal DTD is asserted (in this example, to 'L' level), the AND operation circuit AD outputs a set signal to the SR latch circuit SRLT. The SR latch circuit SRLT controls the fault enable signal FEN to the 'L' level in accordance with the set signal, and controls the fault enable signal FEN to the 'H' level in accordance with a reset signal RST. In the example of FIG. 4, the fault enable signal FEN is asserted at the time of the 'L' level, while the sense enable signal SEN is asserted at the time of the 'H' level, so that the two signals are asserted exclusively. Therefore, in this example, the SR latch circuit SRLT outputs the fault enable signal FEN and the sense enable signal SEN as a single common signal.

When the reset signal RST is output in FIG. 18B, the sense enable signal SEN is asserted, while the fault enable signal FEN is negated. In this state, for example, when the overcurrent detection signal OCD is asserted, the set signal is output from the AND operation circuit AD, and accordingly, the fault enable signal FEN is asserted, while the sense enable signal SEN is negated. Also when the overtemperature detection signal OTD or the temperature-difference detection signal DTD is asserted, the same operations are performed. As described above, when the fault enable signal FEN is asserted, note that the arithmetic processing circuit MPU detects the abnormality based on the detection of the fault current Ift, and controls, for example, the power-supply transistor Qd to be turned off.

Figure 19:
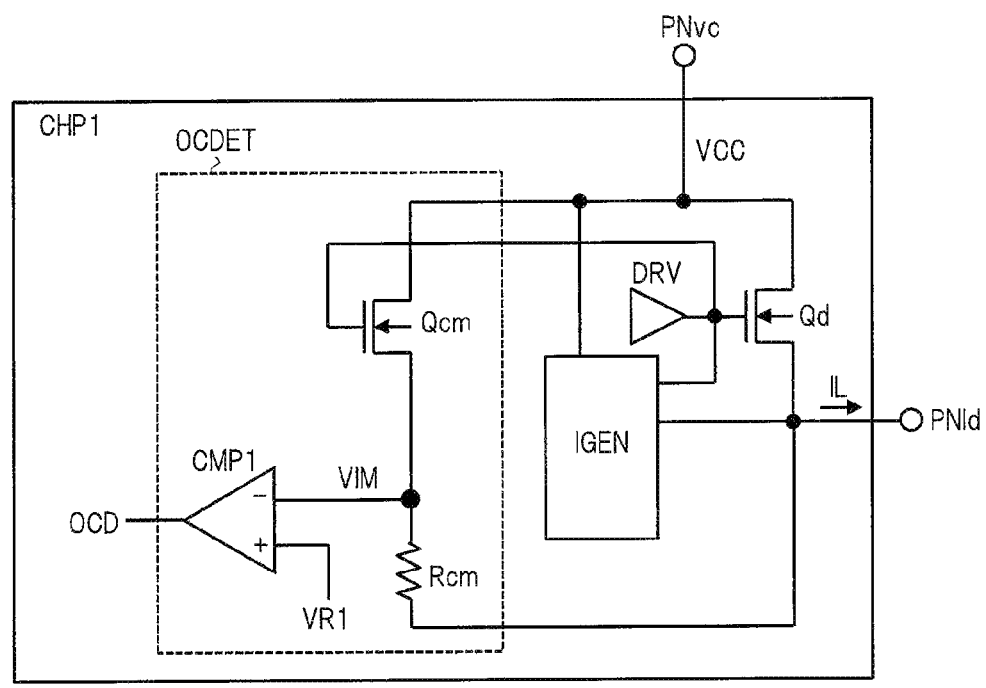
FIG. 19 is a circuit diagram showing a configuration example of an overcurrent detection circuit in FIG. 18A.

FIG. 19 is a circuit diagram showing a configuration example of the overcurrent detection circuit in FIG. 18A. An overcurrent detection circuit OCDET shown in FIG. 19 is provided with a monitoring transistor (for example, nMOS transistor) Qcm, a monitoring resistor Rcm and a comparator circuit CMP1. The drain and gate of the monitoring transistor Qcm are coupled with the drain and gate of the power-supply transistor Qd shown in FIG. 3, respectively. The source of the monitoring transistor Qcm is coupled to the source (external terminal PNld) of the power-supply transistor Qd through the monitoring resistor Rcm.

When a current flows through the power-supply transistor Qd, a current that is almost proportional to the current also flows through the monitoring transistor Qcm. The load current IL becomes a summed current of the currents flowing through the two transistors. However, a size of the monitoring transistor Qcm is formed to be, for example, $\frac{1}{1000}$ to $\frac{1}{10000}$ or other times a transistor size of the power-supply transistor Qd, and therefore, the load current IL is substantially supplied from the power-supply transistor Qd side. The monitoring resistor Rcm generates an overcurrent monitor signal VIM by converting the current flowing through the monitoring transistor Qcm into a voltage. When the voltage level of the overcurrent monitor signal VIM exceeds a predetermined determination reference voltage VR1 (that is, when an overcurrent flows through the power-supply transistor Qd), the comparator circuit CMP1 asserts the overcurrent detection signal OCD.

Figure 20:
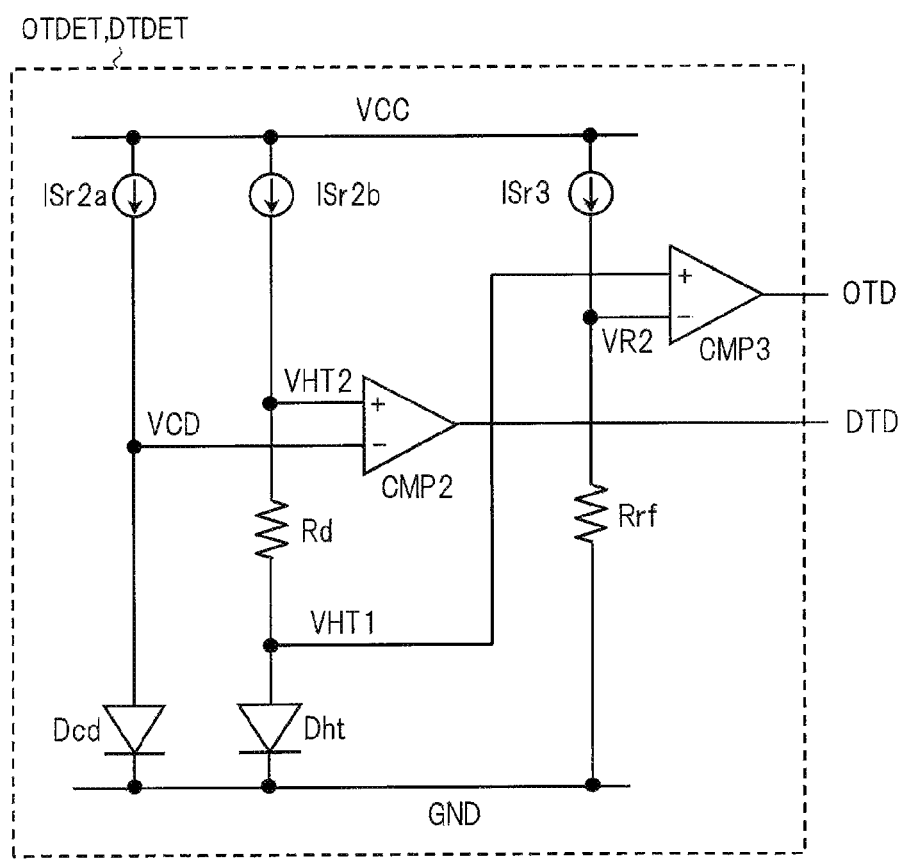
FIG. 20 is a circuit diagram showing a configuration example of an overtemperature detection circuit and a temperature-difference detection circuit in FIG. 18A.
Figure 21:
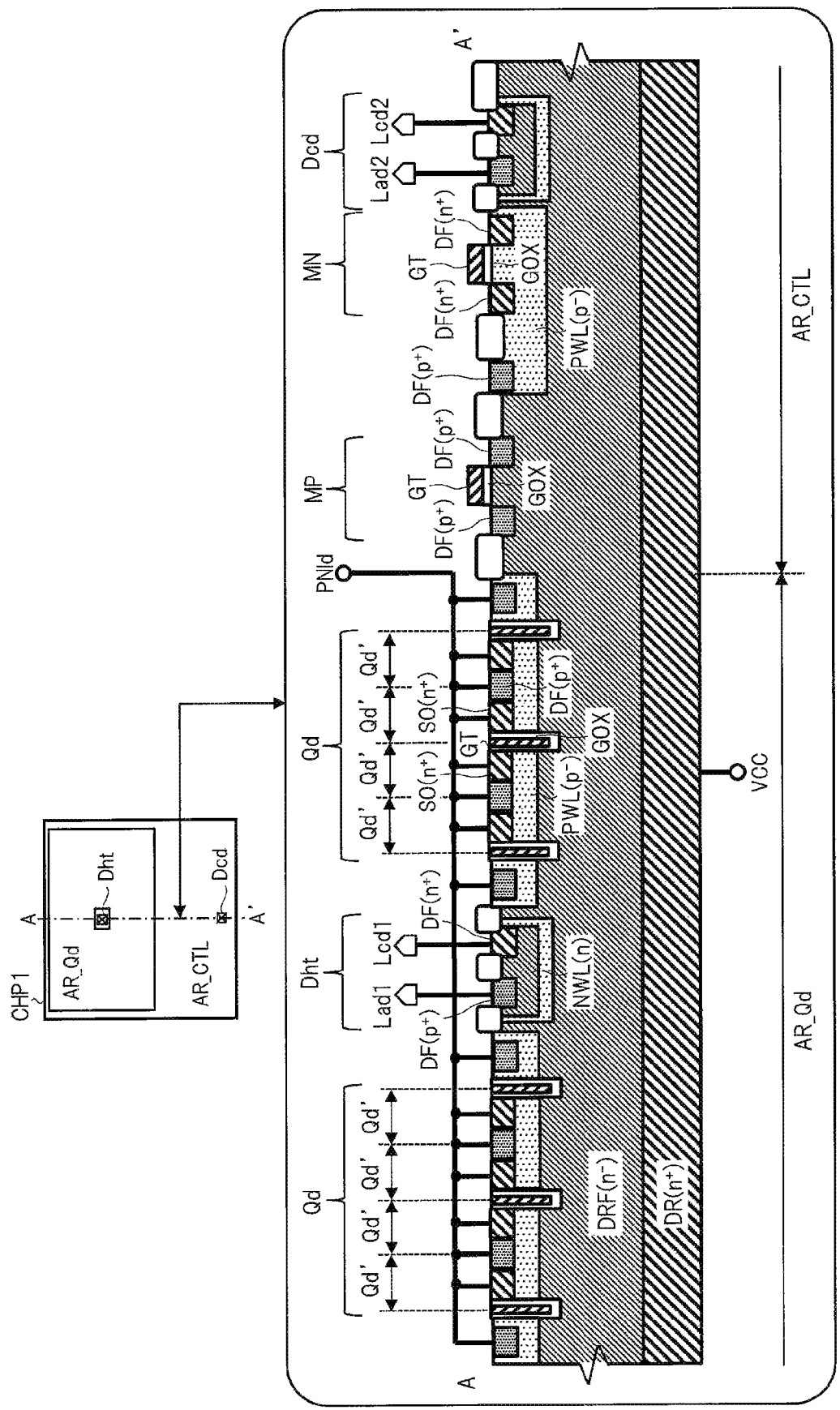
FIG. 21 is a view showing a layout configuration example of a hot sensor and a cold sensor in FIG. 20.

FIG. 20 is a circuit diagram showing a configuration example of the overtemperature detection circuit and the temperature-difference detection circuit shown in FIG. 18A. FIG. 21 is a diagram showing a layout configuration example of a hot sensor and a cold sensor in FIG. 20. As shown in FIG. 21, the semiconductor chip CHP1 has, for example, a formation region AR_Qd of the power-supply transistor Qd that becomes a biased region in the chip entire region and a formation region AR_CTL of a control circuit that becomes the rest of the region.

In the formation region AR_Qd of the power-supply transistor Qd, a hot sensor (more specifically, diode Dht) is arranged at the center of the region. In the formation region AR_CTL of the control circuit, a cold sensor (more specifically, diode Dcd) is arranged at a portion of the region sufficiently separated from the formation region AR_Qd of the power-supply transistor Qd. As the current flowing through the power-supply transistor Qd becomes larger, the temperature of the hot sensor is also higher. At this time, the center portion which is the arrangement portion of the hot sensor particularly becomes a portion at which the heat generated from the power-supply transistor Qd tends to be concentrated. On the other hand, since the cold sensor is arranged at the position separated from the power-supply transistor Qd, a certain degree of time is required for transmitting the heat generated from the power-supply transistor Qd thereto.

The power-supply transistor Qd is constituted by a plurality of unit MOS transistors Qd' that are coupled in parallel with one another. In this example, eight unit MOS transistors Qd' are shown. However, practically, a larger number of unit MOS transistors Qd' are provided. And, practically, only some of the large number of unit MOS transistors Qd' are assigned to the sensing transistor(s) Qcs of FIG. 4 and the monitoring transistor(s) Qcm of FIG. 19.

Here, the unit MOS transistor Qd' is constituted by a longitudinal nMOS transistor whose main surface side is a source and whose rear surface side is a drain. An $n^+$-type drain diffusion layer DR($n^+$) is arranged on the rear surface side, and an $n^-$-type drift layer DRF($n^-$) is arranged above the drain diffusion layer. The drain diffusion layer DR($n^+$) is coupled to the power supply voltage VCC. On the other hand, a $p^-$-type well PWL($p^-$) to be a channel formation region is arranged on the main surface side, and an $n^+$-type source diffusion layer SO($n^+$) is formed inside the well. Moreover, in the well PWL($p^-$), a $p^+$-type diffusion layer DF($p^+$) for use in supplying power to the well is formed. Both of the diffusion layer DF($p^+$) and the source diffusion layer SO($n^+$) are coupled to the external terminal PNld.

On the main surface side, in a portion adjacent to the source diffusion layer SO($n^+$) and the well PWL($p^-$), a trench including a gate insulating film GOX and a gate layer GT is formed. When a predetermined positive voltage is applied to the gate layer GT, an n-channel is formed in the well PWL($p^-$), and the source diffusion layer SO($n^+$) conducts to the drift layer DRF($n^-$) and the drain diffusion layer DR($n^+$) through the n-channel.

The hot sensor (diode Dht) is constituted by a p-n junction diode arranged on the main surface side. More specifically, on the main surface side, an insulating well PWL($p^-$) is arranged, and an n-type well NWL(n) is arranged inside the insulating well. Inside the well NWL(n), a $p^+$-type diffusion layer DF($p^+$) and an $n^+$-type diffusion layer DF($n^+$) are formed. The diffusion layer DF($p^+$) is coupled to an anode wiring Lad1, and the diffusion layer DF($n^+$) is coupled to a cathode wiring Lcd1.

On the other hand, in the formation region AR_CTL of the control circuit, a pMOS transistor MP and an nMOS transistor MN are appropriately arranged. The pMOS transistor MP has a configuration in which two diffusion layers DF($p^+$) becoming a source and a drain are formed on the main surface side, and in which a gate layer GT is formed between them through a gate insulating film GOX. The nMOS transistor MN has a configuration in which a $p^-$-type well PWL($p^-$) is formed on the main surface side, in which two diffusion layers DF($n^+$) becoming a source and a drain are formed inside the well, and in which a gate layer GT is formed between them through the gate insulating film GOX. Moreover, in the formation region AR_CTL of the control circuit, a cold sensor (diode Dcd) having the same configuration as that of the hot sensor is arranged. The diffusion layer DF($p^+$) of the diode Dcd is coupled to an anode wiring Lad2, and the diffusion layer DF($n^+$) of the diode Dcd is coupled to a cathode wiring Lcd2.

Although illustration is omitted, more specifically, in the formation region AR_Qd of the power-supply transistor Qd on the main surface side, note that a source electrode which expands over the entire surface of the region is arranged, and the external terminal PNld is coupled to the source electrode. Moreover, by forming a space in a part of the source electrode, the anode wiring Lad1 and the cathode wiring Lcd1 are drawn out toward the formation region AR_CTL of the control circuit.

Each of the overtemperature detection circuit OTDET and the temperature-difference detection circuit DTDET shown in FIG. 20 is provided with constant current sources ISr2a, ISr2b and ISr3, a hot sensor (diode Dht) and a cold sensor (diode Dcd), comparator circuits CMP2 and CMP3, and resistors Rd and Rrf. The constant current source ISr2a allows a current to flow to the diode Dcd, and the constant current source ISr2b allows a current having the same magnitude as that of the constant current source ISr2a to flow to the diode Dht through the resistor Rd. The comparator circuit CMP2 compares a cold voltage VCD generated on both ends of the diode Dcd with a hot voltage VHT2 with an offset generated on both ends of a series-connected circuit composed of the resistor Rd and the diode Dht.

Each of the diodes Dht and Dcd has such negative temperature characteristics in which both-end voltage decreases as the temperature increases. When temperatures of both of the diodes Dht and Dcd are the same as each other, the hot voltage VHT2 with an offset becomes higher than the cold voltage VCD by the voltage drop of the resistor Rd. In this state, a case of rapid increase in the temperature of the power-supply transistor Qd causes such a situation in which the diode Dht promptly follows this temperature change while the diode Dcd cannot promptly follow the change. Then, only the hot voltage VHT2 with an offset gradually decreases, and finally becomes lower than the cold voltage VCD. At this point of time, the comparator circuit CMP2 asserts a temperature-difference detection signal DTD.

Moreover, the constant current source ISr3 generates a determination reference voltage VR2 by allowing a current to flow through the resistor Rrf. The comparator circuit CMP3 compares a hot voltage VHT1 generated at both ends of the diode Dht with a determination reference voltage VR2. The hot voltage VHT1 decreases as the absolute temperature of the power-supply transistor Qd increases. When the absolute temperature excessively increases, the hot voltage VHT1 becomes lower than the determination reference voltage VR2. At this point of time, the comparator circuit CMP3 asserts an overtemperature detection signal OTD.

<<Main Effects of First Embodiment>>

Figure 9A:
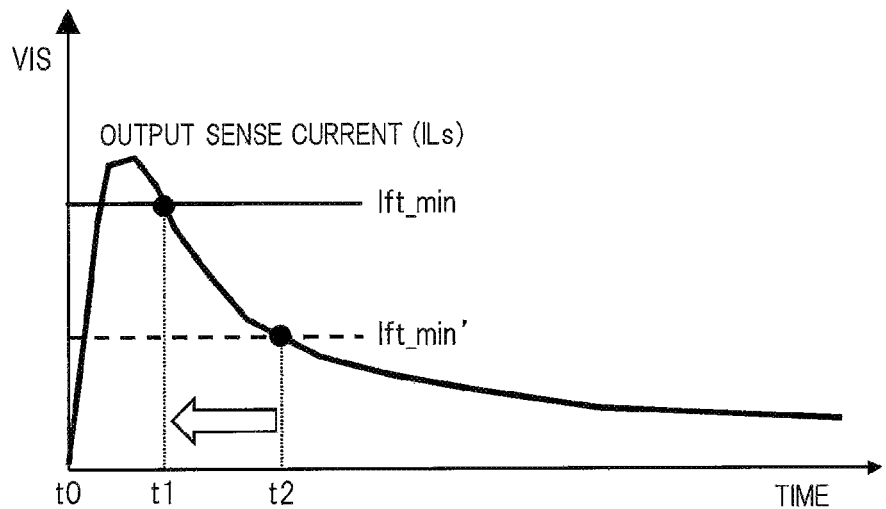
FIG. 9A and FIG. 9B are explanatory diagrams showing one example of effects in a case of usage of the semiconductor device, the electronic control unit and the vehicle device according to the first embodiment of the present invention.
Figure 9B:
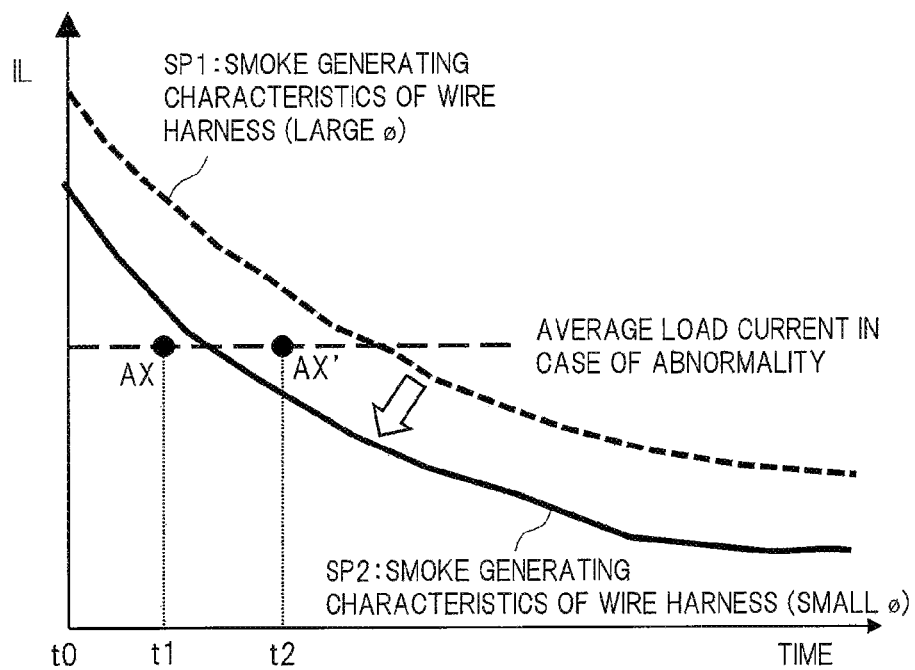

FIGS. 9A and 9B are explanatory diagrams showing one example of effects obtained when the semiconductor device, the electronic control unit and the vehicle apparatus according to the first embodiment of the present invention are used. FIG. 9A shows a relation between the lower limit value in the standard range of the fault current Ift and the characteristics of the sense current ILs at the initial stage in which a power supply to the load LOD starts. By using the system of the present first embodiment, the standard range can be significantly smaller than that of the system of the comparative example shown in FIG. 16.

Accordingly, the lower limit value Ift_min of the standard range in the case of usage of the system of the present first embodiment becomes higher than the lower limit value Ift_min' in the case of usage of the system of the comparative example. As a result, while the arithmetic processing circuit MPU can determine the presence or absence of the abnormality only after time t2 in the system of the comparative example, it can determine the presence or absence of the abnormality even after time t1 earlier than the time in the system of the present first embodiment. In this manner, since various abnormalities can be detected earlier, the arithmetic processing circuit MPU can execute a protective operation in response to the abnormality earlier so that the damages of various components or others can be reliably prevented. In other words, the reliability of the electronic control unit, the vehicle apparatus, and others can be improved.

FIG. 9B shows a relation between the average value of the load current IL at the time of the occurrence of the abnormality (for example, at the time of the load short-circuit) and smoke generating characteristics of the wire harness WH. A horizontal axis represents time, and a vertical axis represents the load current IL. On a line indicating the smoke generating characteristics as a boundary, a left region indicates a safe region, and a right region indicates a forbidden region. When coordinates at a point of time when a certain load current IL has been allowed to flow for a certain period of time enter the forbidden region, there is a burnout risk of the wire harness WH. As the diameter (φ) of the wire harness WH becomes thicker, the safe region is more expanded, so that the wire harness is durable against the load short-circuit for a long period of time. However, on the other hand, its weight more increases.

In the system of the comparative example, the arithmetic processing circuit MPU is allowed to determine the presence or absence of the abnormality only after time t2, and therefore, a situation in which the average load current caused at the time of the occurrence of the abnormality is kept on flowing occurs during a period of time until the time reaches the time t2. Therefore, it is required to use a wire harness WH having such a thick diameter (φ) as indicated by characteristics SP1 so that coordinates AX' obtained when the average load current has been allowed to flow from time t0 to time t2 are within the safe region. On the other hand, in the system of the present first embodiment, it is only required to bring coordinates AX obtained when the average load current has been allowed to flow from time t0 to time t1 earlier than time t2 into the safe region, and therefore, a wire harness WH having a diameter (φ) thinner than that of the system of the comparative example as indicated by characteristics SP2 can be used.

As a result, a weight of the vehicle apparatus can be reduced, and improvement in fuel costs and reduction in costs or others due to the weight reduction can be achieved. In practical use, the user can estimate the time t1 based on the information of the lower limit value Ift_min of the standard range stored in the storage circuit MEM and the characteristic information of the inrush current in accordance with the used load LOD, and can set the minimally-required diameter (φ) of the wire harness WH in accordance with the time t1. The user can apply the set diameter (φ) to, for example, a wire harness WHp of FIG. 1 or others.

Note that, although the standard range ΔIft of the fault current Ift is set based on measurement results under a plurality of temperatures in the present first embodiment, the standard range ΔIft can be determined based on a measurement result (in other words, the determination reference value) under a single temperature depending on cases. In this case, the standard range ΔIft is set by, for example, adding a margin based on the temperature dependence to the single measurement result. Even in this case, the margin caused by the production variations is less than that of the system of FIG. 16, and therefore, various abnormalities can be detected earlier.

Second Embodiment

Configuration of Electronic Control Unit (Second Embodiment)

Figure 10A:
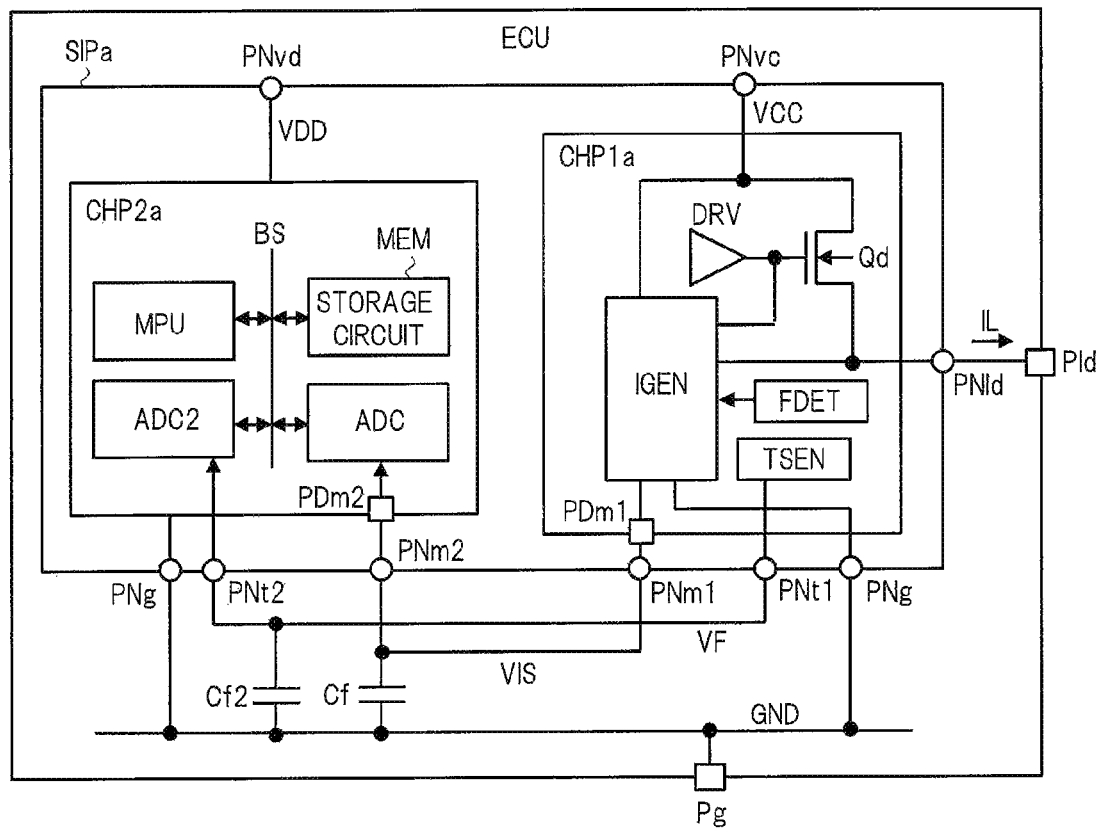
FIG. 10A is a circuit block diagram showing a schematic configuration example of a principal part in an electronic control unit according to a second embodiment of the present invention and FIG. 10B is a circuit diagram showing a configuration example of a temperature sensor circuit in FIG. 10A.
Figure 10B:
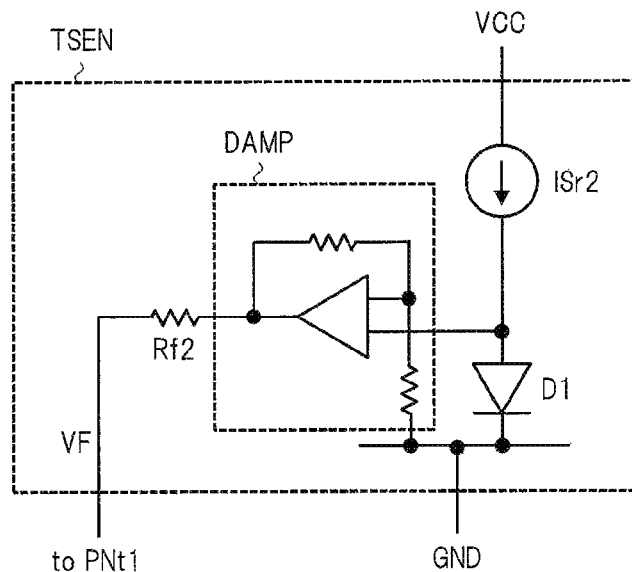

FIG. 10A is a circuit block diagram showing a schematic configuration example of a principal part in an electronic control unit according to a second embodiment of the present invention, and FIG. 10B is a circuit diagram showing a configuration example of a temperature sensor circuit in FIG. 10A. The electronic control unit ECU shown in FIG. 10A is different from that of the configuration example of FIG. 3 mainly in a configuration of a semiconductor device SIPa and in that an LPF capacitor Cf2 is newly provided.

The semiconductor device SIPa of FIG. 10A is provided with external terminals PNt1 and PNt2 in addition to the external terminals PNvc, PNvd, PNg, PNld, PNm1 and PNm2 shown in FIG. 3. The external terminal PNt1 is coupled to the external terminal PNt2 through the wiring substrate of the electronic control unit ECU. The LPF capacitor Cf2 is coupled between the external terminals PNt1, PNt2 and the ground power-supply voltage GND.

Moreover, the semiconductor chip CHP1a of FIG. 10A is constituted by further adding a temperature sensor circuit TSEN to the semiconductor chip CHP1 of FIG. 3. The semiconductor chip CHP2a of FIG. 10A is constituted by further adding an analog-digital conversion circuit ADC2 to be coupled to a bus BS to the semiconductor chip CHP2 of FIG. 3.

The temperature sensor circuit TSEN detects the temperature, and outputs a temperature monitor signal VF having a value indicating the temperature. More specifically, as shown in FIG. 10B, the temperature sensor circuit TSEN is provided with a constant current source ISr2, a diode D1, a differential amplifier circuit DAMP and an LPF resistor Rf2. The constant current source ISr2 supplies a constant current to the diode D1. The diode D1 generates a forward direction voltage in accordance with the magnitude of the constant current. This forward direction voltage has a negative temperature dependence, and becomes smaller as the temperature becomes higher.

The differential amplifier circuit DAMP amplifies the forward direction voltage of the diode D1, and outputs the amplified voltage as a temperature monitor signal VF to the external terminal PNt1 through the LPF resistor Rf2. As similar to FIG. 3, the LPF resistor Rf2 forms a low-pass filter circuit together with the LPF capacitor Cf2. As a result, to the external terminal PNt2, the smoothed temperature monitor signal VF is input. The analog-digital conversion circuit ADC2 converts the temperature monitor signal VF (analog signal), which is input to the external terminal PNt2, into a digital signal. Note that the temperature sensor circuit TSEN may be any circuit as long as it outputs the temperature monitor signal VF having a value indicating the temperature, and is not particularly limited to the configuration shown in FIG. 10B.

<<Method of Inspecting Semiconductor Device>>

Figure 11:
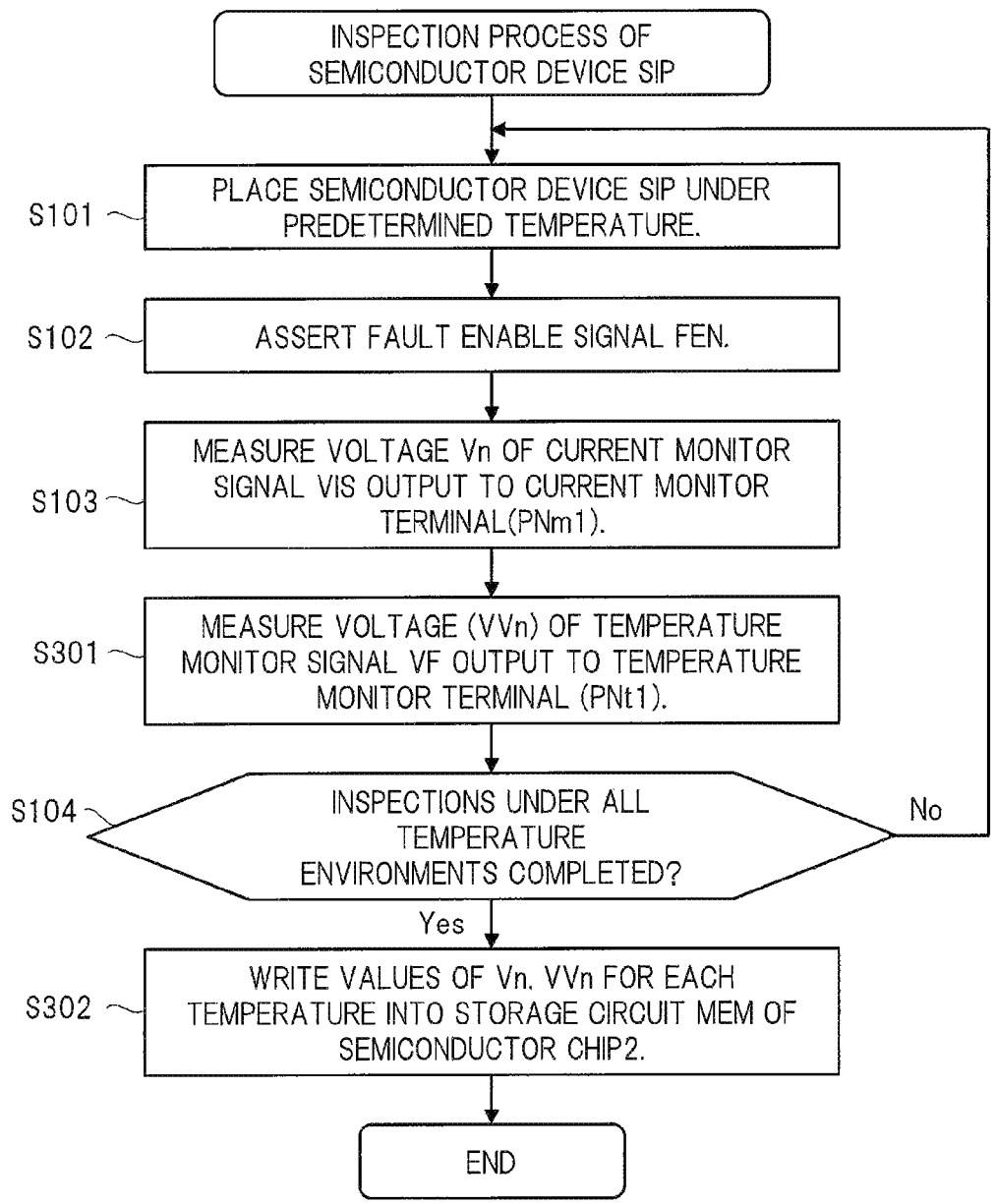
FIG. 11 is a flowchart showing one example of an inspection process for the semiconductor device of FIG. 10A.
Figure 12A:
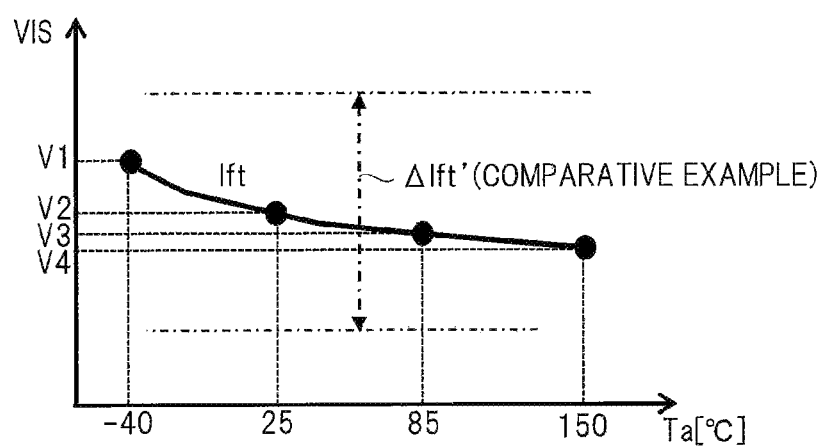
FIG. 12A and FIG. 12B are supplemental views of FIG. 11.
Figure 12B:
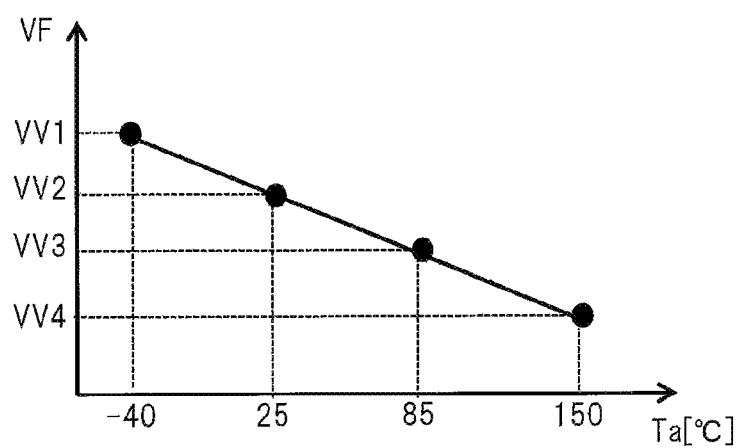

FIG. 11 is a flowchart showing one example of an inspection process for the semiconductor device of FIG. 10A. FIGS. 12A and 12B are supplementary views for FIG. 11. The flowchart shown in FIG. 11 is different from the flowchart shown in FIG. 5A in that step S301 is added between step S103 and step S104 of FIG. 5A, and in that step S105 of FIG. 5A is replaced by step S302 of FIG. 11.

In step S301, under each of temperatures, the inspection device measures a signal level (here, a voltage VVn) of the temperature monitor signal VF to be output to the external terminal PNt1 which becomes the temperature monitor terminal. Moreover, after completion of the measurements under all the temperatures (step S104), the inspection device writes the signal level (voltage VVn) of the temperature monitor signal VF measured in step S301, in addition to the voltage Vn of the current monitor signal VIS for each of the temperatures, into the storage circuit MEM of the semiconductor chip CHP2 (step S302).

When FIGS. 12A and 12B are taken as examples, the respective voltages V1, V2, V3 and V4 of the current monitor signal VIS and the respective voltages VV1, VV2, VV3 and VV4 of the temperature monitor signal VF, which are measured at −40° C., 25° C., 85° C. and 150° C., are written into the storage circuit MEM. The arithmetic processing circuit MPU sets the standard range ΔIft of the fault current Ift based on the respective voltages V1 to V4 and VV1 to VV4 stored in the storage circuit MEM and a digital signal from the analog-digital conversion circuit ADC2 (that is, the temperature monitor signal VF input to the external terminal PNt2).

In setting the standard range ΔIft, various methods can be used. For example, it is assumed that the voltage value of the temperature monitor signal VF obtained by the analog-digital conversion circuit ADC2 is a value in a range between the voltage VV2 and the voltage VV3 in FIG. 12B. In this case, the arithmetic processing circuit MPU can set the standard range ΔIft so that the voltage V2 corresponding to the voltage VV2 is the upper limit value and the voltage V3 corresponding to the voltage VV3 is the lower limit value.

Alternatively, as another method, the arithmetic processing circuit MPU sets, for example, a relational expression between a voltage VVn of the temperature monitor signal VF and a voltage Vn of the current monitor signal VIS based on the storage information in the storage circuit MEM. The relational expression is set as, for example, a linear function or others passing through coordinates (voltage VV1, voltage V1) and coordinates (voltage VV4, voltage V4). The arithmetic processing circuit MPU receives the voltage value of the temperature monitor signal VF obtained by the analog-digital conversion circuit ADC2, and calculates the voltage value of the current monitor signal VIS which becomes the determination reference value by substituting the voltage value to the relational expression. Moreover, the arithmetic processing circuit MPU sets the standard range ΔIft, by adding a margin having a width that is sufficiently narrower than the width from the voltage V1 to the voltage V4 in centering the calculated determination reference value.

By using a method for setting the standard range ΔIft so as to reflect the temperature monitor signal VF as represented by the above-described method, the standard range ΔIft can be narrower than the range in the case of the first embodiment (for example, the range from the voltage V1 to the voltage V4 in FIG. 12A). Thus, various abnormalities can be detected earlier than the case of the first embodiment, and the collateral various effects (for example, the damage preventive effects for various components, the weight reduction of the wire harnesses described above, and others) can be obtained more remarkably.

Third Embodiment

Configuration of Electronic Control Unit (Applied Example)

Figure 13:
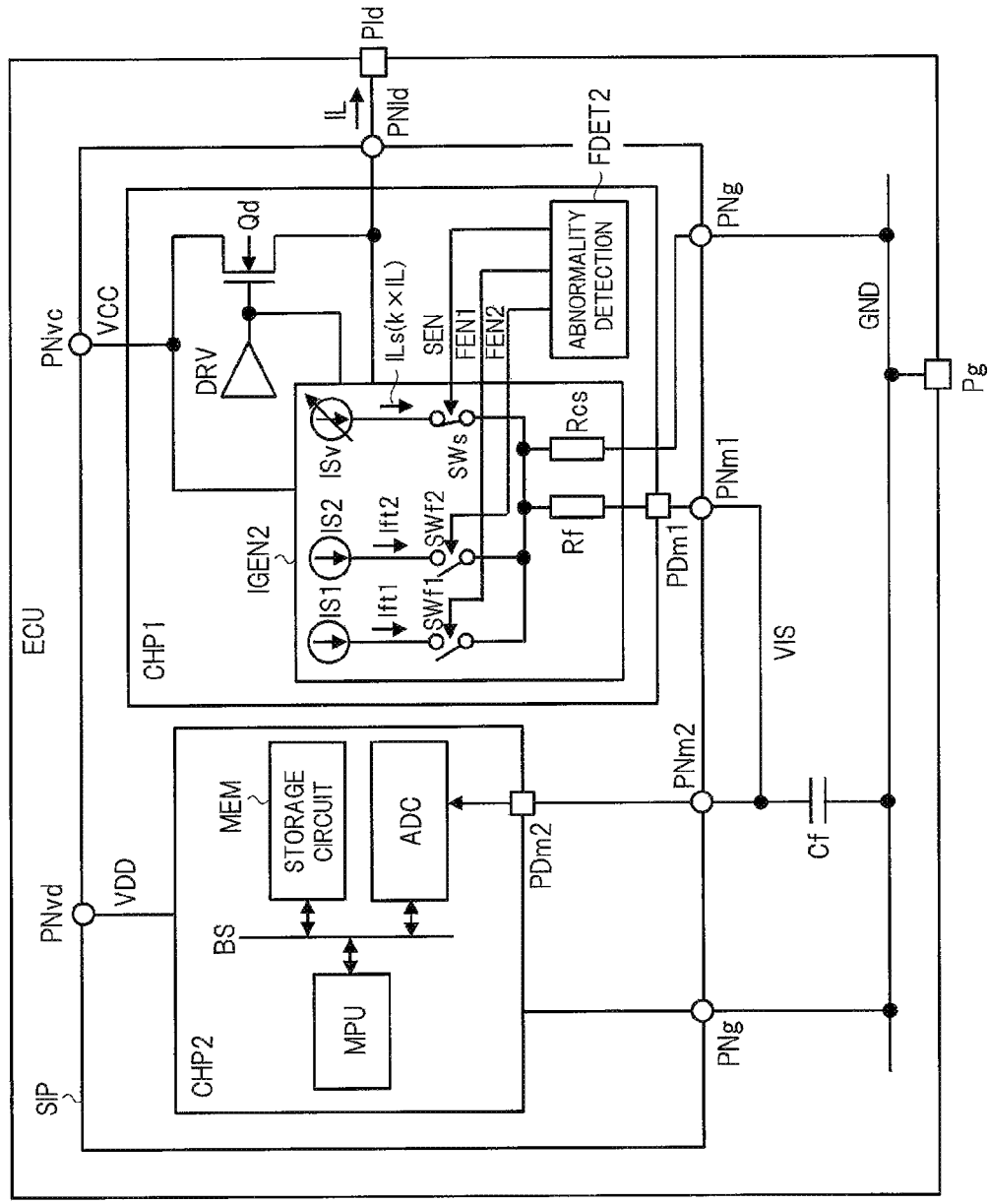
FIG. 13 is a circuit block diagram showing a schematic configuration example of a principal part in an electronic control unit according to a third embodiment of the present invention.

FIG. 13 is a circuit block diagram showing a schematic configuration example of a principal part in an electronic control unit according to a third embodiment of the present invention. An electronic control unit shown in FIG. 13 is different from the configuration example of FIG. 3 in the configurations of the abnormality detection circuit FDET2 and the current generation circuit IGEN2. In the case of FIG. 3, the abnormality detection circuit FDET2 outputs a common fault enable signal when any of the various abnormalities has been detected. However, in this case, it outputs different fault enable signals FEN1 and FEN2 depending on types of the various abnormalities.

In the case of FIG. 3, the current generation circuit IGEN2 is provided with a constant current source IS1 and a fault switch SWf (SWf1 in FIG. 13) in one system. However, in the present embodiment, it is provided with a constant current source IS2 and a fault switch SWf2 in one more system. The fault switch SWf1 is turned on when the fault enable signal FEN1 is output, and the fault switch SWf2 is turned on when the fault enable signal FEN2 is output.

Accordingly, while the current generation circuit IGEN2 allows a fault current Ift1 from the constant current source IS1 to flow to the current detecting resistor Rcs when the fault enable signal FEN1 is output, it allows a fault current Ift2 from the constant current source IS2 to flow to the current detecting resistor Rcs when the fault enable signal FEN2 is output. That is, the fault current Ift1 indicates that the abnormality detection circuit FDET2 has detected a first abnormality, and the fault current Ift2 indicates that the abnormality detection circuit FDET2 has detected a second abnormality that is different from the first abnormality. Moreover, the current value of the fault current Ift1 is different from the current value of the fault current Ift2.

Figure 14:
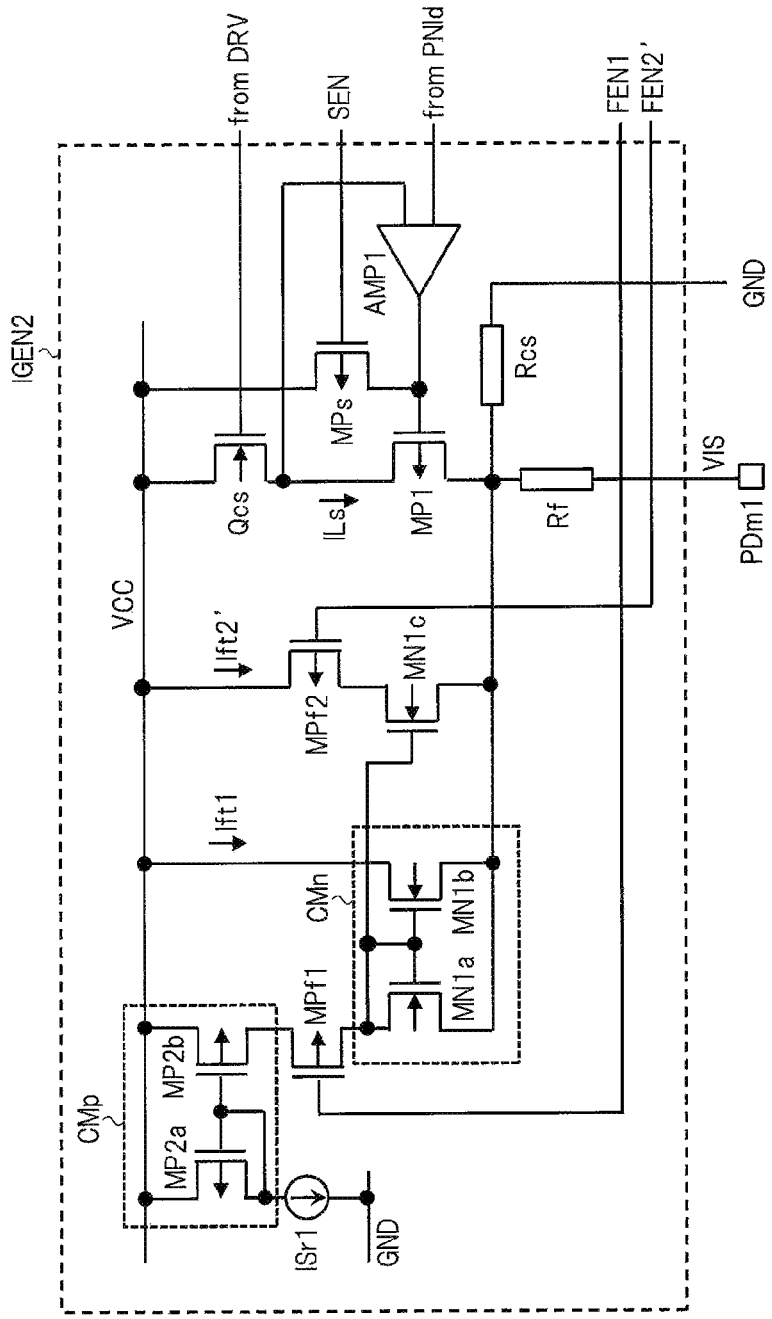
FIG. 14 is a circuit diagram showing a configuration example of a current generation circuit in FIG. 13.

FIG. 14 is a circuit diagram showing a configuration example of the current generation circuit in FIG. 13. The current generation circuit IGEN2 shown in FIG. 13 has a configuration further provided with a pMOS transistor MPf2 and an nMOS transistor MN1c in the current generation circuit IGEN shown in FIG. 4. The nMOS transistor MN1c constitutes the constant current source IS2 of FIG. 13, and the pMOS transistor MPf2 constitutes the fault switch SWf2 of FIG. 13.

The nMOS transistor MN1c constitutes another current mirror circuit different from the nMOS transistor MN1b in cooperation with the nMOS transistor MN1a inside the current mirror circuit CMn. The pMOS transistor MPf2 uses a portion between the power supply voltage VCC and the drain of the nMOS transistor MN1c as a source/drain path, and is controlled to be turned ON/OFF by a fault enable signal FEN2'. Moreover, here, the pMOS transistor MPf1 is controlled to be turned ON/Off by the fault enable signal FEN1.

Here, in the example of FIG. 14, the fault current Ift1 shown in FIG. 13 corresponds to a current flowing through the nMOS transistor MN1b. On the other hand, the fault current Ift2 in FIG. 13 corresponds to a summed current of a current flowing through the nMOS transistor MN1b and a current flowing through the nMOS transistor MN1c. Therefore, in the example of FIG. 14, the abnormality detection circuit FDET2 asserts the fault enable signal FEN1 when the abnormality detection circuit FDET2 detects the first abnormality, and it asserts both of the fault enable signals FEN1 and FEN2' when it detects the second abnormality.

<<Abnormality Determination Method by Arithmetic Processing Circuit>>

Figure 15:
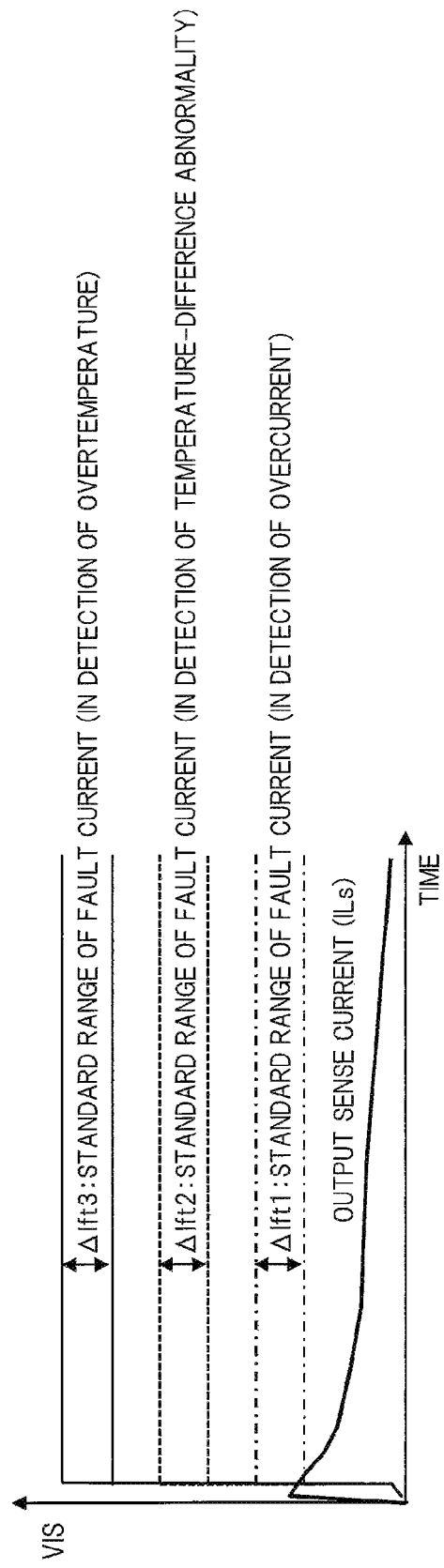
FIG. 15 is an explanatory diagram showing one example of processing contents at the time of determination of either the presence or absence of the detection of the abnormality by the arithmetic processing circuit in the electronic control unit of FIG. 13.

FIG. 15 is an explanatory view showing one example of processing contents used when the arithmetic processing circuit determines the presence or absence of detection of the abnormality in the electronic control unit of FIG. 13. First, as similar to the first embodiment, the storage circuit MEM in FIG. 13 stores each of current values of the fault current Ift1 and Ift2 obtained in the inspection process of the semiconductor device as different determination reference values from each other. Based on the plurality of determination reference values, the arithmetic processing circuit MPU sets a plurality of standard ranges that are not overlapped with one another.

In the example of FIG. 15, the arithmetic processing circuit MPU sets a standard range ΔIft1 based on the determination reference value of the fault current Ift1, a standard range ΔIft2 based on the determination reference value of the fault current Ift2, and a standard range ΔIft3 based on a determination reference value of a fault current (referred to as Ift3). The fault current Ift3 is generated by further adding another system of a constant current source and a fault switch to the configuration of FIG. 13.

For example, the fault current Ift1 is a current indicating that the abnormality detection circuit FDET2 (for example, the overcurrent detection circuit OCDET as shown in FIG. 19) has detected an overcurrent, and the standard range ΔIft1 is 5.0 mA to 5.5 mA, or others. The fault current Ift2 is a current indicating that the abnormality detection circuit FDET2 (for example, the temperature-difference detection circuit DTDET as shown in FIG. 20) has detected a temperature difference abnormality, and the standard range ΔIft2 is 6.0 mA to 6.5 mA, or others. The fault current Ift3 is a current indicating that the abnormality detection circuit FDET2 (for example, the overtemperature detection circuit OTDET as shown in FIG. 20) has detected an overtemperature, and the standard range ΔIft3 is 7.0 mA to 7.5 mA, or others.

As described above, note that the temperature difference abnormality means that a speed of the increase in the absolute temperature of the power-supply transistor Qd is abnormal as different from the overtemperature case (that is, the absolute value of the power-supply transistor Qd is abnormal). More specifically, the abnormality detection circuit FDET2 detects the temperature difference abnormality by, for example, detecting a temperature difference between a temperature sensor mounted on the power-supply transistor Qd on the semiconductor chip CHP1 and a temperature sensor mounted on a portion except for the power-supply transistor Qd on the same semiconductor chip CHP1.

The arithmetic processing circuit MPU determines the presence or absence of the detection of the abnormality in the abnormality detection circuit FDET2 so as to include determination of the abnormality type depending on whether or not a current value indicated by a digital signal from the analog-digital conversion circuit ADC is included in any one of the respective standard ranges ΔIft1, ΔIft2 and ΔIft3. Moreover, at this time, as the current value of the fault current becomes higher, the presence or absence of detection of the abnormality can be determined earlier.

In the example of FIG. 15, for example, time required by the arithmetic processing circuit MPU for recognizing the detection of the overtemperature detected by the abnormality detection circuit FDET2 is shorter than time required by the arithmetic processing circuit MPU for recognizing the detection of the temperature difference abnormality detected by the abnormality detection circuit FDET2. Therefore, it is desirable to assign an abnormality having a higher priority (for example, a higher danger risk) to a fault current having a higher current value. Thus, for example, breakage of various components can be reliably prevented.

As described above, the usage of the electronic control unit of the third embodiment allows the arithmetic processing circuit MPU to recognize the plurality of abnormalities and the types of the abnormalities by using a single external terminal (current monitor terminal) PNm1. The arithmetic processing circuit MPU can change, for example, operation contents of the protective operation in accordance with the types of abnormalities. Under a state in which the input range of the analog-digital conversion circuit ADC is limited, this multiplication can be achieved by significantly narrowing the width of each standard range as described in the first embodiment and others. Note that the width of each standard range can be further narrowed by combination with the temperature information as described in the case of the second embodiment, so that further multiplication or others can be achieved.

In the foregoing, the invention made by the present inventors has been concretely described based on the embodiments. However, the present invention is not limited to the foregoing embodiments and various modifications and alterations can be made within the scope of the present invention. For example, the above-described embodiments have been explained for easily understanding the present invention, but are not always limited to the ones including all structures explained above. Also, a part of the structure of one embodiment can be replaced with the structure of the other embodiment, and besides, the structure of the other embodiment can be added to the structure of one embodiment. Further, the other structure can be added to/eliminated from/replaced with a part of the structure of each embodiment.

For example, in each embodiment described above, measurements of the current monitor signal VIS and the temperature monitor signal VF and writing processes into the storage circuit MEM are performed by using the inspection device. However, depending on cases, a test circuit may be mounted on the semiconductor chip CHP2, and the semiconductor chip CHP2 itself may perform the measurements of the current monitor signal VIS and the temperature monitor signal VF and writing processes into the storage circuit MEM. More specifically, for example, a test program is previously installed on the storage circuit MEM of the semiconductor chip CHP2, and the inspection device issues a predetermined command to the arithmetic processing circuit MPU in step S103 and step S105 in FIG. 5A so as to execute the test program. Into the storage circuit MEM, the arithmetic processing circuit MPU writes the digital signal or others of the current monitor signal VIS measured by the analog-digital conversion circuit ADC based on the test program.

What is claimed is:

1. A semiconductor device comprising:
    a first semiconductor chip and a second semiconductor chip mounted on one package; and
    a load driving terminal,
    wherein the first semiconductor chip includes:
        a power-supply transistor for supplying power to a load through the load driving terminal;
        a driver circuit for driving the power-supply transistor;
        a first terminal;
        a current detecting resistor coupled to the first terminal so as to output a voltage in accordance with a flowing current to the first terminal;
        an abnormality detection circuit for detecting an abnormality; and
        a current generation circuit for generating a sense current on which a current flowing through the load driving terminal is reflected and a fault current indicating that the abnormality detection circuit has detected the abnormality so that the current generation circuit selects either the sense current or the fault current from the current generation circuit to flow through the current detecting resistor in accordance with presence or absence of detection of the abnormality, and
    the second semiconductor chip includes:
        a second terminal to be coupled to the first terminal;
        a first analog-digital conversion circuit for converting an analog signal to be input to the second terminal into a first digital signal;
        a storage circuit for storing a current value of the fault current obtained in an inspection process of the semiconductor device as a determination reference value; and
        an arithmetic processing circuit that sets a standard range based on the determination reference value, and determines the presence or absence of the detection of the abnormality in the abnormality detection circuit based on whether or not a current value indicated by the first digital signal is included within the standard range,
    wherein the current generation circuit includes a variable current source and a constant current source, the variable current source allows the current to flow to the current detecting resistor through the first terminal, and the constant current supply allows a current to flow to the current detecting resistor through the first terminal.

2. The semiconductor device according to claim 1,
    wherein the storage circuit stores a first determination reference value that is the determination reference value at a first temperature and a second determination reference value that is the determination reference value at a second temperature different from the first temperature, and
    the arithmetic processing circuit sets a range between the first determination reference value and the second determination reference value as the standard range.

3. The semiconductor device according to claim 2,
    wherein the arithmetic processing circuit determines the presence or absence of the detection of the abnormality based on whether or not the current value indicated by the first digital signal is continuously included within the standard range for a predetermined period.

4. The semiconductor device according to claim 2,
    wherein the first semiconductor chip further includes:
        a temperature sensor circuit for detecting a temperature; and
        a third terminal for outputting a temperature monitor signal from the temperature sensor circuit,
    the second semiconductor chip further includes:
        a fourth terminal to be coupled to the third terminal; and
        a second analog-digital conversion circuit for converting an analog signal to be input to the fourth terminal into a second digital signal, and
    the storage circuit further stores a first signal level indicating a level of the temperature monitor signal at the first temperature and a second signal level indicating a level of the temperature monitor signal at the second temperature obtained in the inspection process of the semiconductor device, and
    the arithmetic processing circuit sets the standard range based on the second digital signal, the first determination reference value, the first signal level, the second determination reference value and the second signal level stored in the storage circuit.

5. The semiconductor device according to claim 1,
    wherein an inrush current flows through the load at an initial stage when power supply is started, and
    the arithmetic processing circuit determines the presence or absence of the detection of the abnormality at the initial stage.

6. The semiconductor device according to claim 5,
    wherein the current generation circuit generates a first fault current indicating that the abnormality detection circuit has detected a first abnormality, and a second fault current indicating that the abnormality detection circuit has detected a second abnormality different from the first abnormality in a type and having a current value different from a current value of the first fault current, and allows either the first fault current or the second fault current to flow through the current detecting resistor in accordance with the type of the abnormality, and the storage circuit stores the current value of the first fault current and the current value of the second fault current obtained in the inspection process of the semiconductor device as a first abnormality determination reference value and a second abnormality determination reference value, respectively, and the arithmetic processing circuit sets a first standard range based on the first abnormality determination reference value and a second standard range based on the second abnormality determination reference value, and determines presence or absence of the detection of the first abnormality or the second abnormality in the abnormality detection circuit depending on whether or not the current value indicated by the first digital signal is included within the first standard range or the second standard range.

7. The semiconductor device according to claim 6,
wherein the first abnormality has a higher priority than a priority of the second abnormality, and
the first fault current generated by the current generation circuit is larger than the second fault current.

8. An electronic control unit comprising a wiring substrate on which a semiconductor device formed by one package and a connector coupled to the semiconductor device are mounted,
wherein the semiconductor device includes:
  a first semiconductor chip and a second semiconductor chip mounted on the one package; and
  a load driving terminal,
the connector includes a load driving connector terminal coupled to the load driving terminal through a wiring on the wiring substrate and supplies power to a load,
the first semiconductor chip includes:
  a power-supply transistor for supplying power to the load through the load driving terminal and the load driving connector terminal;
  a driver circuit for driving the power-supply transistor;
  a first terminal;
  a current detecting resistor coupled to the first terminal so as to output a voltage in accordance with a flowing current to the first terminal;
  an abnormality detection circuit for detecting an abnormality; and
  a current generation circuit for generating a sense current on which a current flowing through the load driving terminal is reflected and a fault current indicating that the abnormality detection circuit has detected the abnormality so that the current generation circuit selects either the sense current or the fault current from the current generation circuit to flow through the current detecting resistor in accordance with presence or absence of detection of the abnormality, and
the second semiconductor chip includes:
  a second terminal to be coupled to the first terminal;
  a first analog-digital conversion circuit for converting an analog signal to be input to the second terminal into a first digital signal;
  a storage circuit for storing a current value of the fault current obtained in an inspection process of the semiconductor device as a determination reference value; and
  an arithmetic processing circuit that sets a standard range based on the determination reference value, and determines the presence or absence of the detection of the abnormality in the abnormality detection circuit based on whether or not a current value indicated by the first digital signal is included within the standard range,
wherein the current generation circuit includes a variable current source and a constant current source, the variable current source allows the current to flow to the current detecting resistor through the first terminal, and the constant current supply allows a current to flow to the current detecting resistor through the first terminal.

9. The electronic control unit according to claim 8,
wherein the storage circuit stores a first determination reference value to be the determination reference value at a first temperature and a second determination reference value to be the determination reference value at a second temperature different from the first temperature, and
the arithmetic processing circuit sets a range between the first determination reference value and the second determination reference value as the standard range.

10. The electronic control unit according to claim 9,
wherein the first semiconductor chip further includes:
  a temperature sensor circuit for detecting a temperature; and
  a third terminal for outputting a temperature monitor signal from the temperature sensor circuit,
the second semiconductor chip further includes:
  a fourth terminal to be coupled to the third terminal; and
  a second analog-digital conversion circuit for converting an analog signal to be input to the fourth terminal into a second digital signal, and
the storage circuit further stores a first signal level indicating a level of the temperature monitor signal at the first temperature and a second signal level indicating a level of the temperature monitor signal at the second temperature obtained in the inspection process of the semiconductor device, and
the arithmetic processing circuit sets the standard range based on the second digital signal, the first determination reference value, the first signal level, the second determination reference value and the second signal level stored in the storage circuit.

11. The electronic control unit according to claim 8,
wherein an inrush current flows through the load at an initial stage when power supply is started, and
the arithmetic processing circuit determines the presence or absence of the detection of the abnormality at the initial stage.

12. The electronic control unit according to claim 11,
wherein the current generation circuit generates a first fault current indicating that the abnormality detection circuit has detected a first abnormality, and a second fault current indicating that the abnormality detection circuit has detected a second abnormality different from the first abnormality in a type and having a current value different from a current value of the first fault current, and allows either the first fault current or the second fault current to flow through the current detecting resistor in accordance with the type of the abnormality, and the storage circuit stores the current value of the first fault current and the current value of the second fault current obtained in the inspection process of the semiconductor device as a first abnormality determination reference value and a second abnormality determination reference value, respectively, and the arithmetic processing circuit sets a first standard range based on the first abnormality determination reference value and a second standard range based on the second abnormality determination reference value, and determines presence or absence of the detection of the first abnormality or the second abnormality in the abnormality detection circuit depending on whether or not the current value indicated by the first digital signal is included within the first standard range or the second standard range.

13. A semiconductor device comprising:
a power-supply transistor configured for supplying power to a load through a load driving terminal and a load driving connector terminal;
a driver circuit configured for driving the power-supply transistor;
a first terminal;
a current detecting resistor coupled to the first terminal so as to output a voltage in accordance with a flowing current to the first terminal;
an abnormality detection circuit configured for detecting an abnormality;
a current generation circuit configured for generating a sense current on which a current flowing through the load driving terminal is reflected and a fault current indicating that the abnormality detection circuit has detected the abnormality so that the current generation circuit selects either the sense current or the fault current from the current generation circuit to flow through the current detecting resistor in accordance with presence or absence of detection of the abnormality;
a second terminal to be coupled to the first terminal;
a first analog-digital conversion circuit configured for converting an analog signal to be input to the second terminal into a first digital signal;
a storage circuit configured for storing a current value of the fault current obtained in an inspection process of the semiconductor device as a determination reference value; and
an arithmetic processing circuit configured to set a standard range based on the determination reference value, and determines the presence or absence of the detection of the abnormality in the abnormality detection circuit based on whether or not a current value indicated by the first digital signal is included within the standard range,
wherein the current generation circuit includes a variable current source and a constant current source, the variable current source allows the current to flow to the current detecting resistor through the first terminal, and the constant current supply allows a current to flow to the current detecting resistor through the first terminal.

14. The semiconductor device according to claim 13, wherein the storage circuit stores a first determination reference value that is the determination reference value at a first temperature and a second determination reference value that is the determination reference value at a second temperature different from the first temperature, and the arithmetic processing circuit sets a range between the first determination reference value and the second determination reference value as the standard range.

15. The semiconductor device according to claim 14, further comprises:
a temperature sensor circuit for detecting a temperature; and
a third terminal for outputting a temperature monitor signal from the temperature sensor circuit;
a fourth terminal to be coupled to the third terminal; and
a second analog-digital conversion circuit for converting an analog signal to be input to the fourth terminal into a second digital signal.

16. The semiconductor device according to claim 15, wherein the storage circuit further stores a first signal level indicating a level of the temperature monitor signal at the first temperature and a second signal level indicating a level of the temperature monitor signal at the second temperature obtained in the inspection process of the semiconductor device, and the arithmetic processing circuit sets the standard range based on the second digital signal, the first determination reference value, the first signal level, the second determination reference value and the second signal level stored in the storage circuit.

17. The semiconductor device according to claim 13, wherein an inrush current flows through the load at an initial stage when power supply is started, and the arithmetic processing circuit determines the presence or absence of the detection of the abnormality at the initial stage.

18. The vehicle apparatus according to claim 13, wherein the current generation circuit generates a first fault current indicating that the abnormality detection circuit has detected a first abnormality, and a second fault current indicating that the abnormality detection circuit has detected a second abnormality different from the first abnormality in a type and having a current value different from a current value of the first fault current, and allows either the first fault current or the second fault current to flow through the current detecting resistor in accordance with the type of the abnormality, and the storage circuit stores the current value of the first fault current and the current value of the second fault current obtained in the inspection process of the semiconductor device as a first abnormality determination reference value and a second abnormality determination reference value, respectively, and the arithmetic processing circuit sets a first standard range based on the first abnormality determination reference value and a second standard range based on the second abnormality determination reference value, and determines presence or absence of the detection of the first abnormality or the second abnormality in the abnormality detection circuit depending on whether or not the current value indicated by the first digital signal is included within the first standard range or the second standard range.

19. A semiconductor device comprising:
a first semiconductor chip; and
a second semiconductor chip separately mounted on one package with the first semiconductor chip,
wherein the first semiconductor chip includes:

a current detecting resistor configured to output a voltage in accordance with a flowing current to a first terminal;

an abnormality detection circuit configured for detecting an abnormality; and a current generation circuit configured for generating a sense current on which a current flowing through the load driving terminal is reflected and a fault current indicating that the abnormality detection circuit has detected the abnormality so that the current generation circuit allows from a selection of either the sense current or the fault current from the current generation circuit to flow through the current detecting resistor in accordance with presence or absence of detection of the abnormality, and the second semiconductor chip includes:

a first analog-digital conversion circuit for converting an analog signal to be input to a second terminal into a first digital signal, the second terminal connected to the first terminal;

a storage circuit for storing a current value of the fault current obtained in an inspection process of the semiconductor device as a determination reference value; and an arithmetic processing circuit that sets a standard range based on the determination reference value, and determines the presence or absence of the detection of the abnormality in the abnormality detection circuit based on whether or not a current value indicated by the first digital signal is included within the standard range, wherein the current generation circuit includes a variable current source and a constant current source, the variable current source allows the current to flow to the current detecting resistor through the first terminal, and the constant current supply allows a current to flow to the current detecting resistor through the first terminal.

20. The semiconductor device according to claim 19, wherein the storage circuit stores a first determination reference value that is the determination reference value at a first temperature and a second determination reference value that is the determination reference value at a second temperature different from the first temperature, the arithmetic processing circuit sets a range between the first determination reference value and the second determination reference value as the standard range, the current detecting resistor is coupled to the first terminal that is an external terminal so as to output a current monitor signal having a voltage in accordance with a flowing current to the external terminal, and the current generation circuit includes the variable current source and a sense switch, and the constant current source and a fault switch, the variable current source allows the current to flow to the current detecting resistor through the sense switch and the external terminal, and the constant current supply allows a current to flow to the current detecting resistor through the fault switch and the external terminal.

* * * * *